US012588227B2

(12) United States Patent
Shimizu

(10) Patent No.: US 12,588,227 B2
(45) Date of Patent: Mar. 24, 2026

(54) METHOD OF MANUFACTURING SEMICONDUCTOR DEVICE AND SEMICONDUCTOR DEVICE

(71) Applicant: KABUSHIKI KAISHA TOSHIBA, Tokyo (JP)

(72) Inventor: Tatsuo Shimizu, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 455 days.

(21) Appl. No.: 18/177,210

(22) Filed: Mar. 2, 2023

(65) Prior Publication Data

US 2024/0088258 A1 Mar. 14, 2024

(30) Foreign Application Priority Data

Sep. 12, 2022 (JP) ................................. 2022-144471

(51) Int. Cl.
| | |
|---|---|
| *H10D 12/01* | (2025.01) |
| *H01L 21/04* | (2006.01) |
| *H01L 21/324* | (2006.01) |
| *H10D 30/66* | (2025.01) |
| *H10D 62/832* | (2025.01) |

(52) U.S. Cl.
CPC ....... *H10D 12/031* (2025.01); *H01L 21/0465* (2013.01); *H01L 21/324* (2013.01); *H10D 30/668* (2025.01); *H10D 62/8325* (2025.01)

(58) Field of Classification Search
CPC ............... H10D 12/031; H10D 30/668; H10D 62/8325; H10D 12/038; H10D 30/0297; H10D 62/393; H01L 21/0465; H01L 21/324; H01L 21/046; H01L 21/26506
See application file for complete search history.

(56) References Cited

U.S. PATENT DOCUMENTS

| | | | |
|---|---|---|---|
| 6,054,352 | A | 4/2000 | Ueno |
| 2015/0021684 | A1 | 1/2015 | Lee et al. |
| 2017/0345905 | A1 | 11/2017 | Siemieniec et al. |

(Continued)

FOREIGN PATENT DOCUMENTS

| | | |
|---|---|---|
| JP | H10233503 A | 9/1998 |
| JP | 2017220667 A | 12/2017 |

(Continued)

OTHER PUBLICATIONS

Not yet published, Japanese Patent Application No. 2022-045395, filed on Mar. 22, 2022.

(Continued)

*Primary Examiner* — Syed I Gheyas
(74) *Attorney, Agent, or Firm* — Maier & Maier, PLLC

(57) ABSTRACT

A method of manufacturing a semiconductor device according to an embodiment includes: forming a mask material having an opening on a surface of a silicon carbide layer; forming a trench in the silicon carbide layer using the mask material as a mask; performing first ion implantation for implanting carbon (C) into a bottom face of the trench using the mask material as a mask; forming a sidewall material on a side face of the trench; performing second ion implantation for implanting a p-type first impurity into the bottom face of the trench using the sidewall material as a mask; and performing heat treatment at 1600° C. or more.

5 Claims, 27 Drawing Sheets

(56)         References Cited

U.S. PATENT DOCUMENTS

| | | | | |
|---|---|---|---|---|
| 2019/0245079 A1* | 8/2019 | Imai | .................... | H10D 62/393 |
| 2021/0288156 A1 | 9/2021 | Fukui et al. | | |
| 2022/0005925 A1* | 1/2022 | Shimizu | ............... | H01L 21/049 |
| 2022/0013639 A1 | 1/2022 | Tanaka et al. | | |
| 2023/0307236 A1* | 9/2023 | Shimizu | ................ | H10D 30/66 |
| 2023/0307536 A1 | 9/2023 | Shimizu | | |

FOREIGN PATENT DOCUMENTS

| | | | |
|---|---|---|---|
| JP | 2019140159 A | 8/2019 |
| JP | 2019195081 A | 11/2019 |
| JP | 2021182639 A | 11/2021 |
| JP | 2022012282 A | 1/2022 |
| JP | 2022016286 A | 1/2022 |
| JP | 2023139714 A | 10/2023 |
| JP | 2023140254 A | 10/2023 |

OTHER PUBLICATIONS

Not yet published, Japanese Patent Application No. 2022-107884, filed on Jul. 4, 2022.
Not yet published, Japanese Patent Application No. 2022-045394, filed on Mar. 22, 2022.
U.S. Appl. No. 17/929,419, projected publication date on Sep. 28, 2023; Corresponds to NPL Nos. 1 and 2.
U.S. Appl. No. 17/823,088, projected publication date on Sep. 28, 2023; Corresponds to NPL No. 3.

* cited by examiner

FIG.1     CROSS SECTION TAKEN ALONG LINE AA'

FIG.2

FIRST DIRECTION

SECOND DIRECTION

100

30   28    12   14

A ——————————————————————— A' p⁺   n⁺      n⁺   p⁺   n⁺      n⁺   p⁺   n⁺      n⁺   p⁺

11a      11b      11c w    d1    w    d1    w

FIG.11  CROSS SECTION TAKEN ALONG LINE AA'

FIG.12 CROSS SECTION TAKEN ALONG LINE BB'

FIG.13   CROSS SECTION TAKEN ALONG LINE CC'

FIG.14

FIG.25 CROSS SECTION TAKEN ALONG LINE DD'

FIG.26 CROSS SECTION TAKEN ALONG LINE EE'

METHOD OF MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2022-144471, filed on Sep. 12, 2022, the entire contents of which are incorporated herein by reference.

FIELD

Embodiments described herein relate generally to a method of manufacturing a semiconductor device manufacturing and a semiconductor device.

BACKGROUND

Silicon carbide (SiC) is expected as a material for next-generation semiconductor devices. Silicon carbide has excellent physical properties as compared to silicon, such as a band gap of about 3 times, a breakdown field strength of about 10 times, and a thermal conductivity of about 3 times that of silicon. By utilizing the physical properties, it is possible to achieve a semiconductor device that can operate at high temperature with low loss.

A metal oxide semiconductor field effect transistor (MOS-FET) using silicon carbide is required to reduce on-resistance. In order to reduce the on-resistance of the MOSFET, a trench gate type vertical MOSFET in which a gate electrode is provided in a trench is adopted. By scaling-down the trench gate type vertical MOSFET, the on-resistance can be further reduced.

BRIEF DESCRIPTION OF THE DRAWINGS

FIG. 2 is a schematic plan view of the semiconductor device according to the first embodiment;

FIG. 14 is a schematic plan view of the semiconductor device according to the second embodiment;

DETAILED DESCRIPTION

Figure 1:
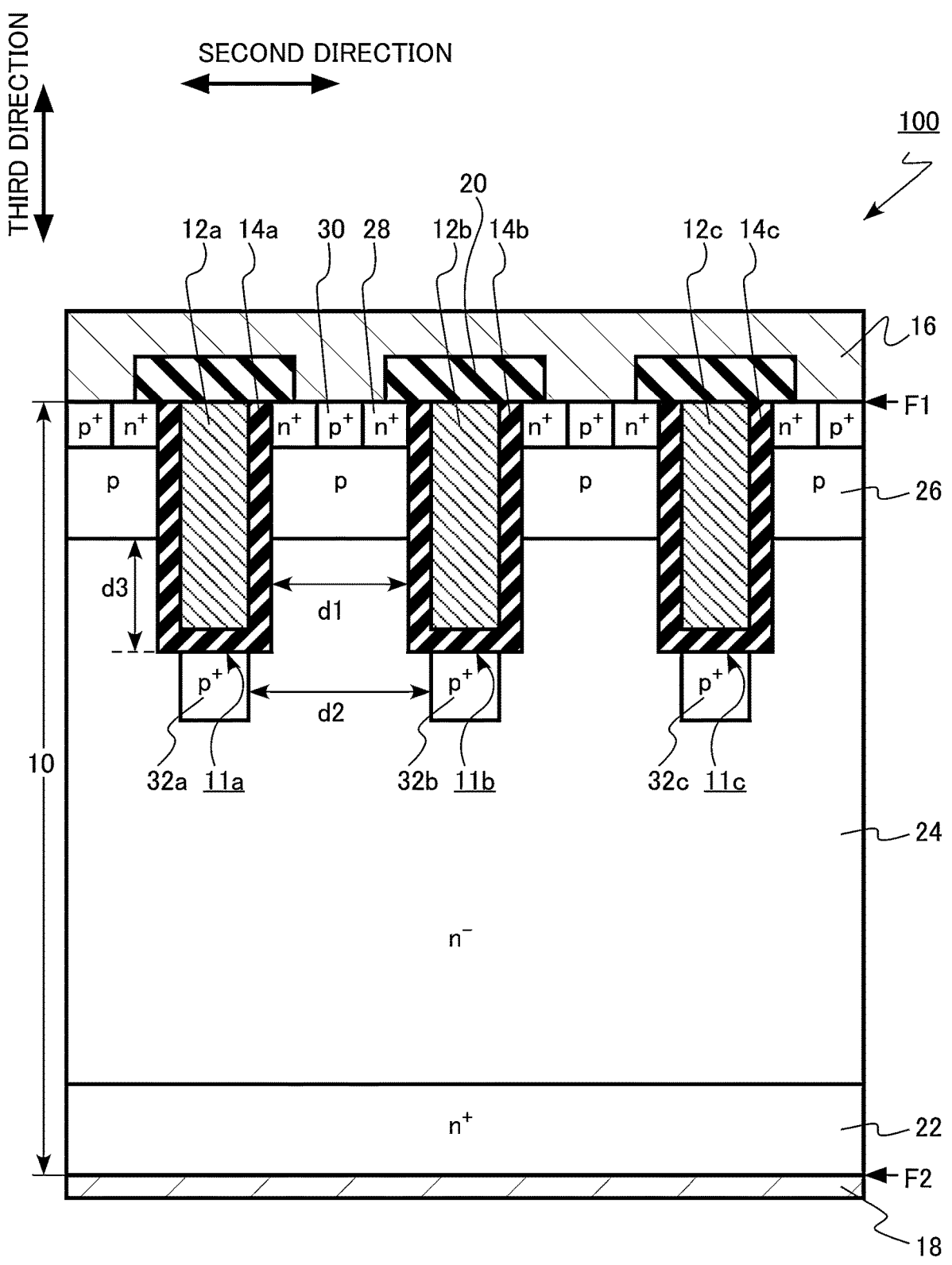
FIG. 1 is a schematic cross-sectional view of a semiconductor device according to a first embodiment.

A method of manufacturing a semiconductor device according to an embodiment includes: forming a mask material having an opening on a surface of a silicon carbide layer; forming a trench in the silicon carbide layer using the mask material as a mask; performing first ion implantation for implanting carbon (C) into a bottom face of the trench using the mask material as a mask; forming a sidewall material on a side face of the trench; performing second ion implantation for implanting a p-type first impurity into the bottom face of the trench using the sidewall material as a mask; and performing heat treatment at 1600° C. or more.

Hereinafter, embodiments of the present disclosure will be described with reference to the drawings. In the following description, the same or similar members and the like will be denoted by the same reference numerals, and the description of the members and the like once described will be appropriately omitted.

In the following description, when notations of $n^{++}$, $n^+$, n, and $n^-$, and $p^{++}$, p, and $p^-$ are used, these notations represent the relative level of the impurity concentration in each conductivity type. That is, $n^{++}$ indicates that the n-type impurity concentration is relatively higher than $n^+$, $n^+$ indicates that the n-type impurity concentration is relatively higher than n, and n-indicates that the n-type impurity concentration is relatively lower than n. In addition, $p^{++}$ indicates that the p-type impurity concentration is relatively higher than $p^+$, $p^+$ indicates that the p-type impurity concentration is relatively higher than p, and $p^-$ indicates that the p-type impurity concentration is relatively lower than p. In addition, an $n^{++}$-type, an $n^+$-type, and an $n^-$-type may be simply referred to as an n-type, and a $p^{++}$-type, a $p^+$-type, and a $p^-$-type may be simply referred to as a p-type.

The impurity concentration can be measured by, for example, secondary ion mass spectrometry (SIMS). Further, the relative level of the impurity concentration can be determined from the level of the carrier concentration obtained by scanning capacitance microscopy (SCM), for example. Further, the distance such as the width and depth of the impurity region can be obtained by SIMS, for example. Also, the distance such as the width and depth of the impurity region can be obtained from an SCM image, for example.

The width of the trench, the interval between the trenches, the depth of the trench, the thickness of the insulating layer, and the like can be measured, for example, on an image of SIMS or a transmission electron microscope (TEM).

First Embodiment

A method of manufacturing a semiconductor device according to a first embodiment includes: forming a mask material having an opening on a surface of a silicon carbide layer; forming a trench in the silicon carbide layer using the mask material as a mask; performing first ion implantation for implanting carbon (C) into a bottom face of the trench using the mask material as a mask; forming a sidewall material on a side face of the trench; performing second ion implantation for implanting a p-type first impurity into the bottom face of the trench using the sidewall material as a mask; and performing heat treatment at 1600° C. or more.

Further, a semiconductor device according to the first embodiment includes: a silicon carbide layer having a first face parallel to a first direction and a second direction perpendicular to the first direction, and a second face parallel to the first face; a first trench disposed in the silicon carbide layer and extending in the first direction on the first face; a first gate electrode disposed in the first trench; a first gate insulating layer disposed between the first gate electrode and the silicon carbide layer; a second trench disposed in the silicon carbide layer, the second trench extending in the first direction on the first face, and a first distance between the first trench and the second trench in the second direction being 1.0 μm or less; a second gate electrode disposed in the second trench; a second gate insulating layer disposed between the second gate electrode and the silicon carbide layer; an n-type first silicon carbide region disposed in the silicon carbide layer; a p-type second silicon carbide region disposed in the silicon carbide layer, disposed between the first silicon carbide region and the first face, and disposed between the first trench and the second trench; an n-type third silicon carbide region disposed in the silicon carbide layer and disposed between the second silicon carbide region and the first face; a p-type fourth silicon carbide region disposed in the silicon carbide layer, disposed between the first silicon carbide region and the first trench, and having a first p-type impurity concentration higher than $1\times10^{20}$ cm$^{-3}$; a p-type fifth silicon carbide region disposed in the silicon carbide layer, disposed between the first silicon carbide region and the second trench, and having a second p-type impurity concentration higher than $1\times10^{20}$ cm$^{-3}$; a first electrode disposed on a side of the first face with respect to the silicon carbide layer and electrically connected to the second silicon carbide region and the third silicon carbide region; and a second electrode disposed on a side of the second surface with respect to the silicon carbide layer, in which a second distance in the second direction between the fourth silicon carbide region and the fifth silicon carbide region is ½ or more of the first distance.

FIG. 1 is a schematic cross-sectional view of the semiconductor device according to the first embodiment. The semiconductor device according to the first embodiment is a trench gate type vertical MOSFET 100 using silicon carbide. The MOSFET 100 is an n-channel MOSFET using electrons as carriers.

Figure 2:
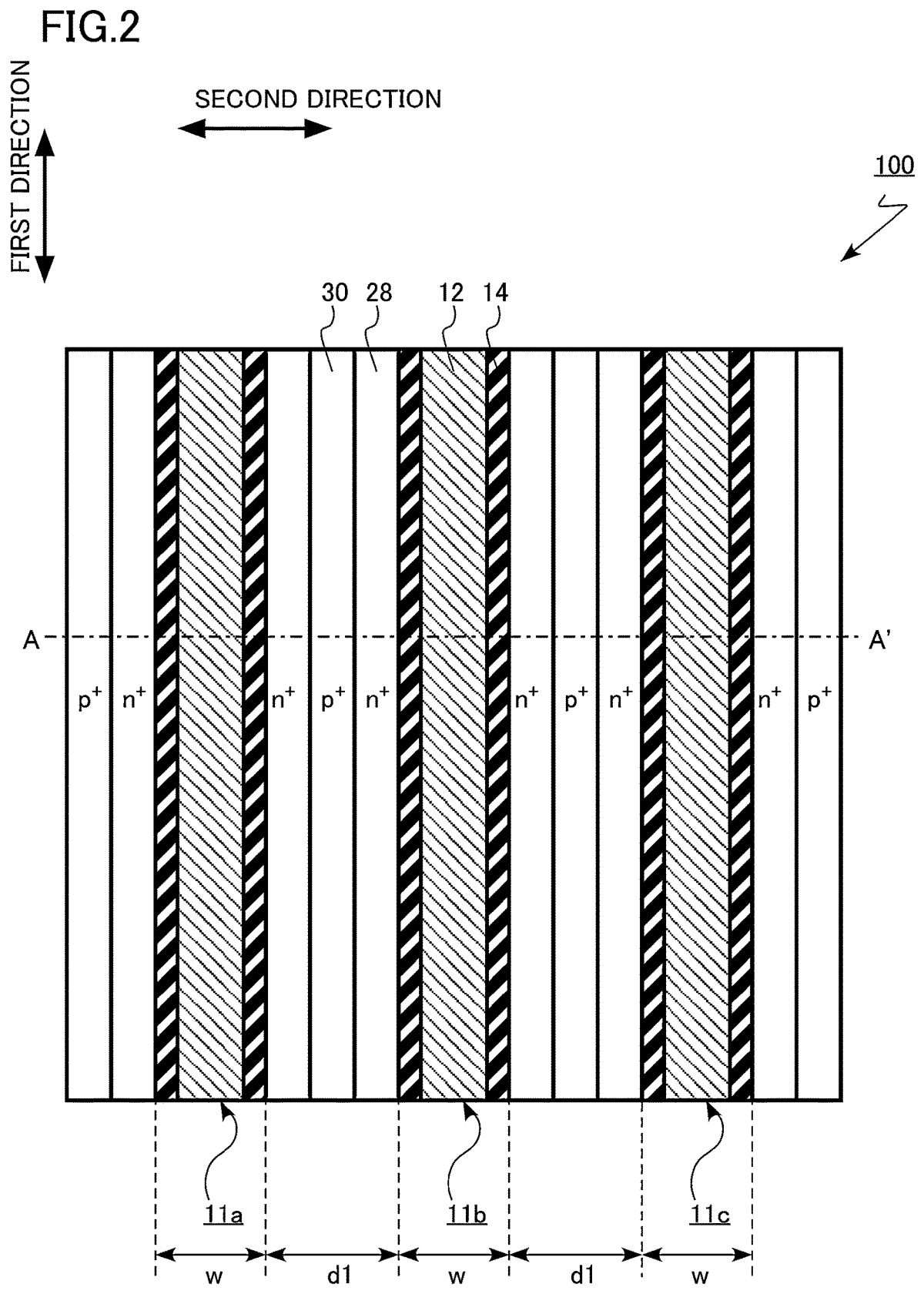

FIG. 2 is a schematic plan view of the semiconductor device according to the first embodiment. FIG. 2 is a plan view of a first face (F1 in FIG. 1) of FIG. 1. The first direction and the second direction are directions parallel to a first face F1. Further, the second direction is a direction perpendicular to the first direction. FIG. 1 is a cross section taken along line AA' in FIG. 2.

The MOSFET 100 includes a silicon carbide layer 10, a first trench 11a, a second trench 11b, a third trench 11c, a first gate electrode 12a, a second gate electrode 12b, a third gate electrode 12c, a first gate insulating layer 14a, a second gate insulating layer 14b, a third gate insulating layer 14c, a source electrode 16 (first electrode), a drain electrode 18 (second electrode), and an interlayer insulating layer 20.

Hereinafter, the first trench 11a, the second trench 11b, and the third trench 11c may be collectively referred to as a trench 11. Hereinafter, the first gate electrode 12a, the second gate electrode 12b, and the third gate electrode 12c may be collectively referred to as a gate electrode 12. Hereinafter, the first gate insulating layer 14a, the second gate insulating layer 14b, and the third gate insulating layer 14c may be collectively referred to as a gate insulating layer 14.

In the silicon carbide layer 10, an $n^+$-type drain region 22, an $n^-$-type drift region 24 (first silicon carbide region), a p-type body region 26 (second silicon carbide region), an $n^+$-type source region 28 (third silicon carbide region), a $p^+$-type contact region 30, a $p^+$-type first electric field relaxation region 32a (fourth silicon carbide region), a $p^+$-type second electric field relaxation region 32b (fifth silicon carbide region), and a $p^+$-type third electric field relaxation region 32c are provided.

Hereinafter, the first electric field relaxation region 32a, the second electric field relaxation region 32b, and the third electric field relaxation region 32c may be collectively referred to as an electric field relaxation region 32.

The silicon carbide layer 10 is single crystal SiC. The silicon carbide layer 10 is, for example, 4H-SiC.

The silicon carbide layer 10 has the first face ("F1" in FIG. 1) and a second face ("F2" in FIG. 1). The first face F1 and the second face F2 face each other. Hereinafter, the first face F1 is also referred to as a surface, and the second face F2 is also referred to as a back surface. Hereinafter, the "depth" means a depth in a direction toward the second face F2 with respect to the first face F1.

In FIGS. 1 and 2, the first direction and the second direction are parallel to the first face F1 and the second face F2. The third direction is perpendicular to the first face F1 and the second face F2.

Figure 3:
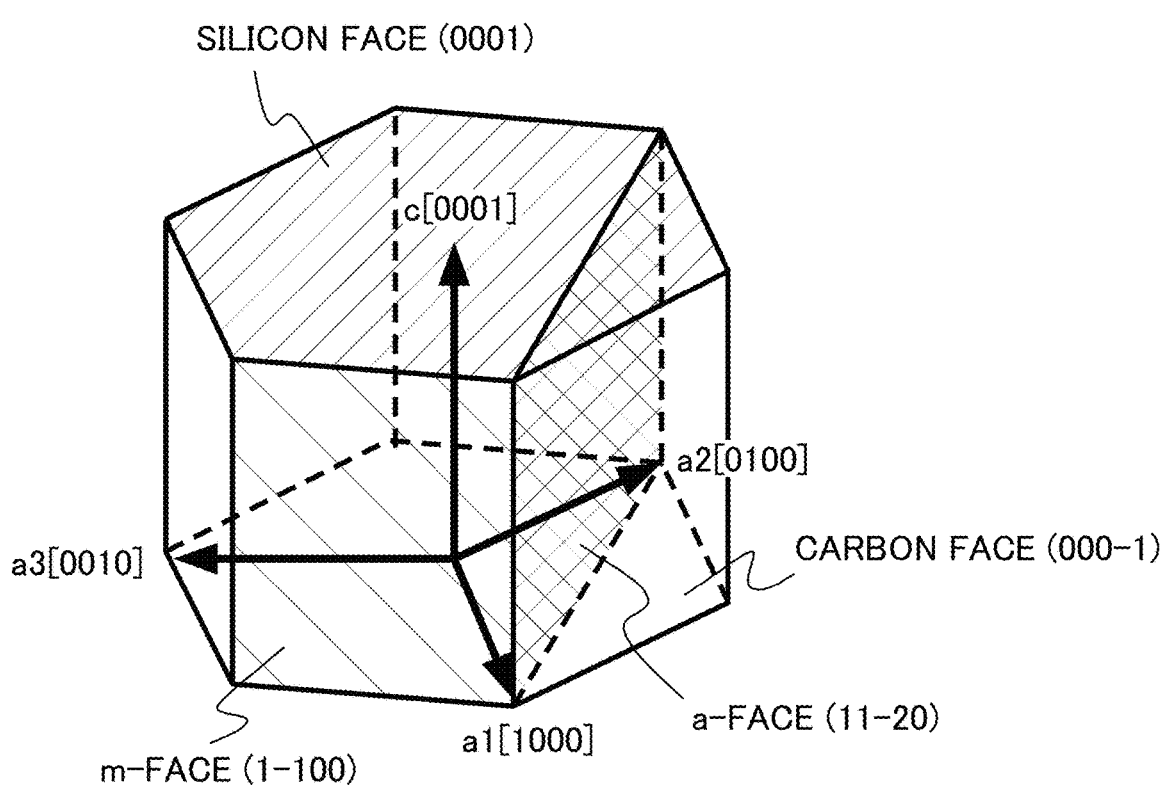
FIG. 3 is a diagram illustrating a crystal structure of a silicon carbide semiconductor.

FIG. 3 is a diagram illustrating a crystal structure of a silicon carbide semiconductor. A typical crystal structure of the silicon carbide semiconductor is a hexagonal crystal system such as 4H-SiC. One of faces having a c-axis along the axial direction of the hexagonal prism as a normal line (top face of the hexagonal prism) is a (0001) face. A face equivalent to the (0001) face is referred to as a silicon face and denoted as a {0001} face. Silicon (Si) is arranged on the silicon face.

The other of the faces having the c-axis along the axial direction of the hexagonal prism as a normal line (top face of the hexagonal prism) is a (000-1) face. A face equivalent to the (000-1) face is referred to as a carbon face and denoted as a {000-1} face. Carbon (C) is arranged on the carbon face.

On the other hand, a side face (columnar face) of the hexagonal prism is an m-face which is a face equivalent to a (1-100) face, that is, a {1-100} face. In addition, a face passing through a pair of ridgelines not adjacent to each other is an a-face which is a face equivalent to a (11-20) face, that is, a {11-20} face. Both silicon (Si) and carbon (C) are arranged on the m-face and the a-face.

The first face F1 is, for example, a face inclined at 0 degrees or more and 8 degrees or less with respect to the (0001) face. That is, the first face F1 is a face whose normal line is inclined at 0 degrees or more and 8 degrees or less with respect to the c-axis in the [0001] direction. In other words, the off angle with respect to the (0001) face is 0 degrees or more and 8 degrees or less. The second face F2 is, for example, a face inclined at 0 degrees or more and 8 degrees or less with respect to the (000-1) face.

The (0001) face is called a silicon face. The (000-1) face is called a carbon face.

The inclination direction of the first face F1 and the second face F2 is, for example, the [11-20] direction. The [11-20] direction is the a-axis direction. In FIG. 1, for example, the first direction illustrated in FIG. 2 is in the same plane as the a-axis direction.

The trench 11 is present in the silicon carbide layer 10. The trench 11 is a recess provided in the silicon carbide layer 10. The trench 11 extends in the first direction as illustrated in FIG. 2.

A width (w in FIG. 2) of the trench 11 in the second direction is, for example, equal to or less than a first distance (d1 in FIGS. 1 and 2) between two adjacent trenches 11.

The width (w in FIG. 2) of the trench 11 in the second direction is, for example, 0.2 $\mu$m or more and 1.0 $\mu$m or less.

The first distance d1 between the two adjacent trenches 11 is 1.0 $\mu$m or less. The first distance d1 between the two adjacent trenches 11 is, for example, 0.2 $\mu$m or more and 1.0 $\mu$m or less. For example, the first distance d1 between the first trench 11a and the second trench 11b is 0.2 $\mu$m or more and 1.0 $\mu$m or less.

The trenches 11 are repeatedly arranged in the second direction. The repetition pitch of the trenches 11 in the second direction is, for example, 0.4 $\mu$m or more and 2.0 $\mu$m or less.

The depth of the trench 11 is, for example, 0.5 $\mu$m or more and 2.0 $\mu$m or less.

The inclination angle of the side face of the trench 11 with respect to the m-face or the a-face is, for example, 0 degrees or more and 5 degrees or less.

The gate electrode 12 is provided in the trench 11. The first gate electrode 12a is provided in the first trench 11a. The second gate electrode 12b is provided in the second trench 11b. The third gate electrode 12c is provided in the third trench 11c.

The gate electrode 12 is provided between the source electrode 16 and the drain electrode 18. The gate electrode 12 extends in the first direction.

The gate insulating layer 14 is provided between the gate electrode 12 and the silicon carbide layer 10. The first gate insulating layer 14a is provided between the first gate electrode 12a and the silicon carbide layer 10. The second gate insulating layer 14b is provided between the second gate electrode 12b and the silicon carbide layer 10. The third gate insulating layer 14c is provided between the third gate electrode 12c and the silicon carbide layer 10.

The gate insulating layer 14 is provided between each region of the source region 28, the body region 26, the drain region 22, and the electric field relaxation region 32 and the gate electrode 12.

The gate electrode 12 is a conductive layer. The gate electrode 12 is, for example, polycrystalline silicon containing a p-type impurity or an n-type impurity.

The gate insulating layer 14 is, for example, a silicon oxide film. For example, a high-k insulating film (high dielectric constant insulating film such as HfSiON, ZrSiON, or AlON) is applicable to the gate insulating layer 14. Furthermore, for example, a stacked film of a silicon oxide film (SiO$_2$) and a High-K insulating film is also applicable to the gate insulating layer 14.

The interlayer insulating layer 20 is provided on the gate electrode 12. The interlayer insulating layer 20 is, for example, a silicon oxide film.

The source electrode 16 is provided on the surface side with respect to the silicon carbide layer 10. The source electrode 16 is provided on the surface of the silicon carbide layer 10.

The source electrode 16 is electrically connected to the source region 28. The source electrode 16 is in contact with the source region 28.

The source electrode 16 is electrically connected to the contact region 30. The source electrode 16 is in contact with the contact region 30.

The source electrode 16 contains metal. The metal forming the source electrode 16 has, for example, a stacked structure of titanium (Ti) and aluminum (Al).

The drain electrode 18 is provided on the back surface side with respect to the silicon carbide layer 10.

The drain electrode 18 is provided on the back surface of the silicon carbide layer 10. The drain electrode 18 is in contact with the drain region 22.

The drain electrode 18 is, for example, metal or a metal semiconductor compound. The drain electrode 18 contains, for example, a material selected from the group consisting of nickel silicide, titanium (Ti), nickel (Ni), silver (Ag), and gold (Au).

The n$^+$-type drain region 22 is provided on the back surface side of the silicon carbide layer 10. The drain region 22 contains, for example, nitrogen (N) as an n-type impurity. The n-type impurity concentration of the drain region 22 is, for example, $1 \times 10^8$ cm$^{-3}$ or more and $1 \times 10^{21}$ cm$^{-3}$ or less.

The n$^-$-type drift region 24 is provided on the drain region 22. The drift region 24 is provided between the drain region 22 and the surface of the silicon carbide layer 10.

The drift region 24 functions as a current path during the on-operation of the MOSFET 100. In addition, the drift region 24 has a function of maintaining the breakdown voltage of the MOSFET 100 by forming a depletion layer when the MOSFET 100 is turned off.

The drift region 24 contains, for example, nitrogen (N) as an n-type impurity. The n-type impurity concentration of the drift region 24 is, for example, $4 \times 10^{14}$ cm$^{-3}$ or more and $1 \times 10^8$ cm$^{-3}$ or less. The thickness of the drift region 24 in the third direction is, for example, 5 $\mu$m or more and 150 $\mu$m or less.

The p-type body region 26 is provided between the drift region 24 and the surface of the silicon carbide layer 10. The body region 26 is provided between two adjacent trenches 11. The body region 26 is provided between the first trench 11a and the second trench 11b.

The body region 26 is in contact with the gate insulating layer 14. The body region 26 functions as a channel region of the MOSFET 100. For example, during the on-operation of the MOSFET 100, a channel through which electrons flow is formed in a region of the body region 26 in contact with the gate insulating layer 14.

The body region 26 contains, for example, aluminum (Al) as a p-type impurity. The p-type impurity concentration of the body region 26 is, for example, $5 \times 10^{16}$ cm$^{-3}$ or more and $5 \times 10^{17}$ cm$^{-3}$ or less. The depth of the body region 26 is, for example, 0.5 µm or more and 1.0 µm or less.

The n$^+$-type source region 28 is provided between the body region 26 and the surface of the silicon carbide layer 10. The source region 28 is in contact with the source electrode 16. The source region 28 is in contact with the trench 11. The source region 28 is in contact with the gate insulating layer 14.

The n-type impurity concentration of the source region 28 is, for example, $1 \times 10^{19}$ cm$^{-3}$ or more and $1 \times 10^{21}$ cm$^{-3}$ or less. The depth of the source region 28 is smaller than the depth of the body region 26. The depth of the source region 28 is, for example, 0.1 µm or more and 0.6 µm or less. The distance between the drift region 24 and the source region 28 is, for example, 0.1 µm or more and 0.6 µm or less.

The p$^+$-type contact region 30 is provided between the body region 26 and the surface of the silicon carbide layer 10. The contact region 30 is in contact with the source electrode 16. The contact region 30 is adjacent to the source region 28. The contact region 30 is in contact with the source region 28.

The contact region 30 has a function of reducing electric resistance between the source electrode 16 and the body region 26.

The contact region 30 contains, for example, aluminum (Al) as a p-type impurity. The p-type impurity concentration of the contact region 30 is higher than the p-type impurity concentration of the body region 26, for example. The p-type impurity concentration of the contact region 30 is, for example, $1 \times 10^{19}$ cm$^{-3}$ or more and $1 \times 10^{22}$ cm$^{-3}$ or less.

The p$^+$-type first electric field relaxation region 32a is provided between the drift region 24 and the first trench 11a. The first electric field relaxation region 32a is provided between the drift region 24 and the bottom face of the first trench 11a. The first electric field relaxation region 32a is in contact with the bottom face of the first trench 11a.

The p$^+$-type second electric field relaxation region 32b is provided between the drift region 24 and the second trench 11b. The second electric field relaxation region 32b is provided between the drift region 24 and the bottom face of the second trench. The second electric field relaxation region 32b is in contact with the bottom face of the second trench.

The p$^+$-type third electric field relaxation region 32c is provided between the drift region 24 and the third trench 11c. The third electric field relaxation region 32c is provided between the drift region 24 and the bottom face of the third trench 11c. The third electric field relaxation region 32c is in contact with the bottom face of the third trench 11c.

The drift region 24 is provided between two adjacent electric field relaxation regions 32.

The electric field relaxation region 32 contains, for example, aluminum (Al) as a p-type impurity. The p-type impurity concentration of the electric field relaxation region 32 is higher than the p-type impurity concentration of the body region 26, for example. The p-type impurity concentration of the electric field relaxation region 32 is higher than, for example, $1 \times 10^{20}$ cm$^{-3}$. The p-type impurity concentration of the electric field relaxation region 32 is, for example, $5 \times 10^{20}$ cm$^{-3}$ or more and $5 \times 10^{22}$ cm$^{-3}$ or less.

The electric field relaxation region 32 can be formed, for example, by forming a trench in the silicon carbide layer 10 and then ion-implanting aluminum (Al) into the silicon carbide layer 10 from the bottom face of the trench.

The electric potential of the electric field relaxation region 32 is fixed to the electric potential of the source electrode 16 at a portion not illustrated. The electric potential of the electric field relaxation region 32 is fixed to the electric potential. The electric field relaxation region 32 has a function of relaxing an electric field applied to the gate insulating layer 14 at the bottom of the trench 11.

A second distance (d2 in FIG. 1) between two adjacent electric field relaxation regions 32 is, for example, ½ or more of the first distance (d1 in FIGS. 1 and 2) between two adjacent trenches 11.

A third distance (d3 in FIG. 1) in the third direction between the electric field relaxation region 32 and the body region 26 coincides with, for example, the distance between the bottom face of the trench 11 and the body region 26.

Next, an example of a method of manufacturing the semiconductor device according to the first embodiment will be described.

FIGS. 4, 5, 6, 7, 8, 9, and 10 are explanatory diagrams of the method of manufacturing the semiconductor device according to the first embodiment. FIGS. 4 to 10 are schematic cross-sectional views illustrating the semiconductor device in the middle of manufacturing. FIGS. 4 to 10 illustrate cross sections corresponding to FIG. 1.

Figure 4:
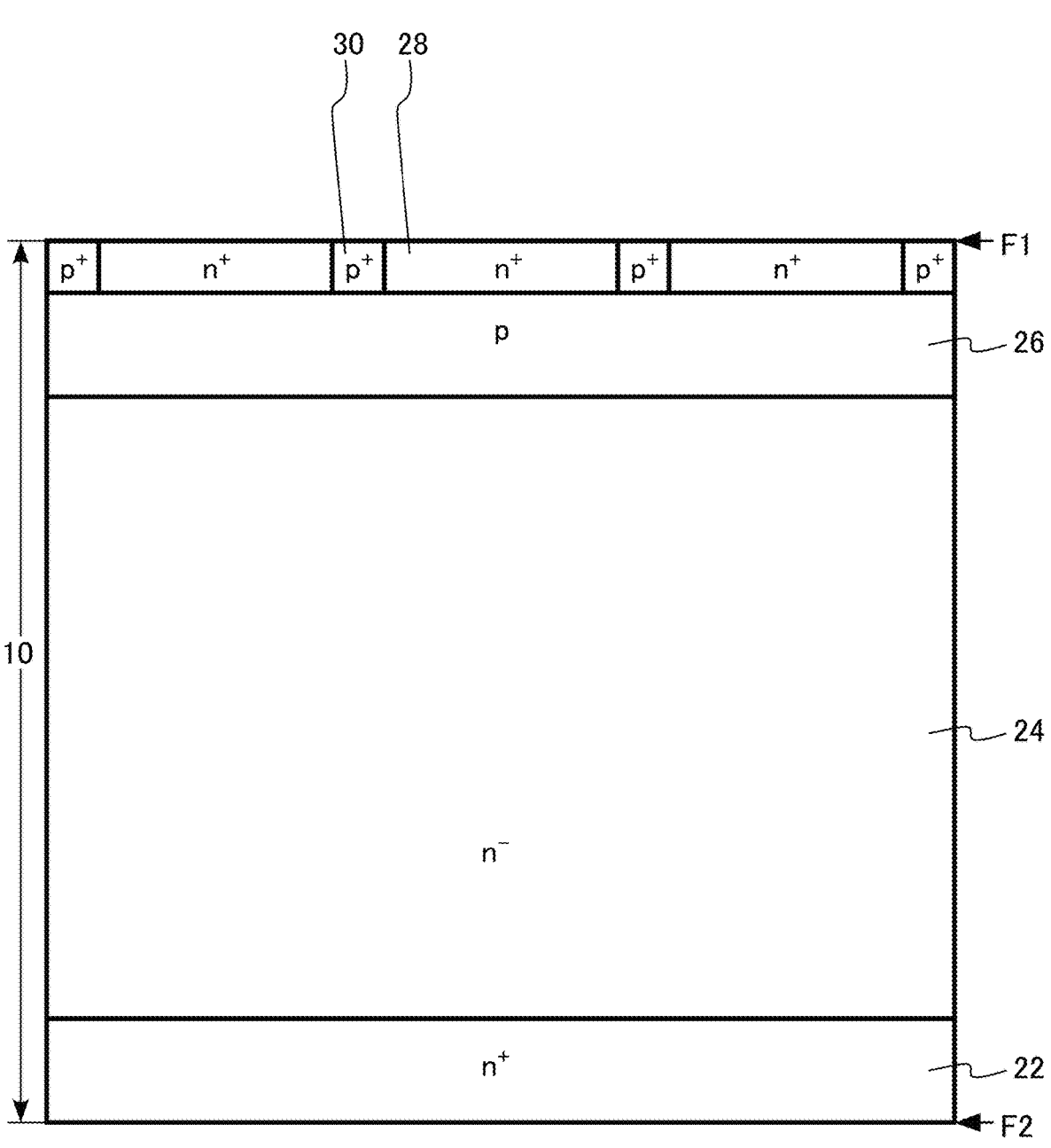
FIG. 4 is an explanatory diagram of a method of manufacturing the semiconductor device according to the first embodiment.

First, the silicon carbide layer 10 having the first face F1 (surface) which is a silicon face and the second face F2 (back surface) which is a carbon face is prepared (FIG. 4). In the silicon carbide layer 10, the n$^+$-type drain region 22, the n$^-$-type drift region 24, the p-type body region 26, the n$^+$-type source region 28, and the p$^+$-type contact region 30 are formed.

The drift region 24 is formed on the drain region 22 by, for example, an epitaxial growth method. The body region 26, the source region 28, and the contact region 30 are formed, for example, on the surface of the drift region 24 using an ion implantation method.

Figure 5:
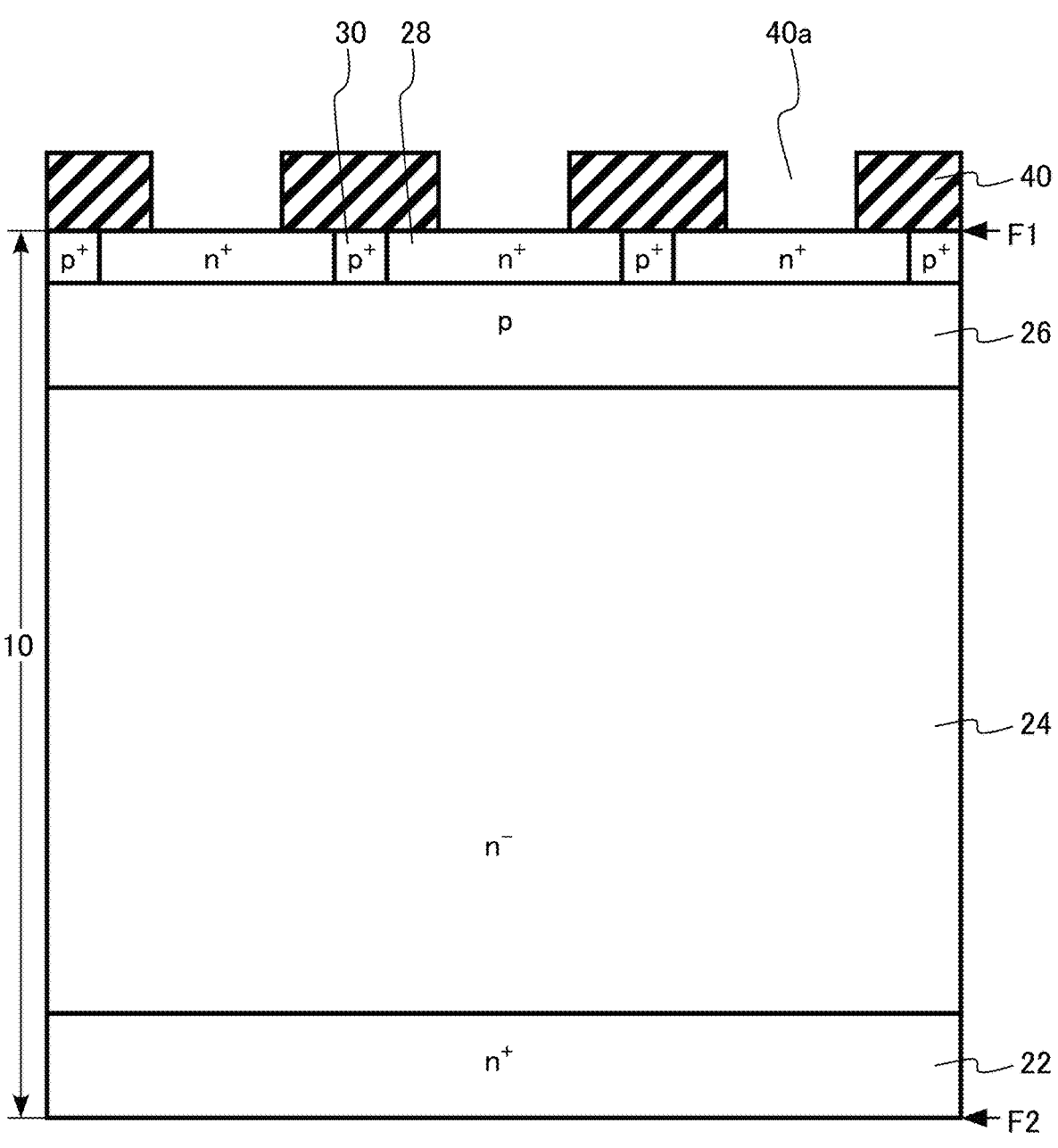
FIG. 5 is an explanatory diagram of the method of manufacturing the semiconductor device according to the first embodiment.

Next, a mask material 40 having an opening 40a on the surface of the silicon carbide layer 10 is formed (FIG. 5). The mask material 40 is, for example, an insulator. The mask material 40 is, for example, silicon oxide.

The mask material 40 is formed by, for example, depositing an insulating film and patterning the insulating film by photolithography and etching.

Figure 6:
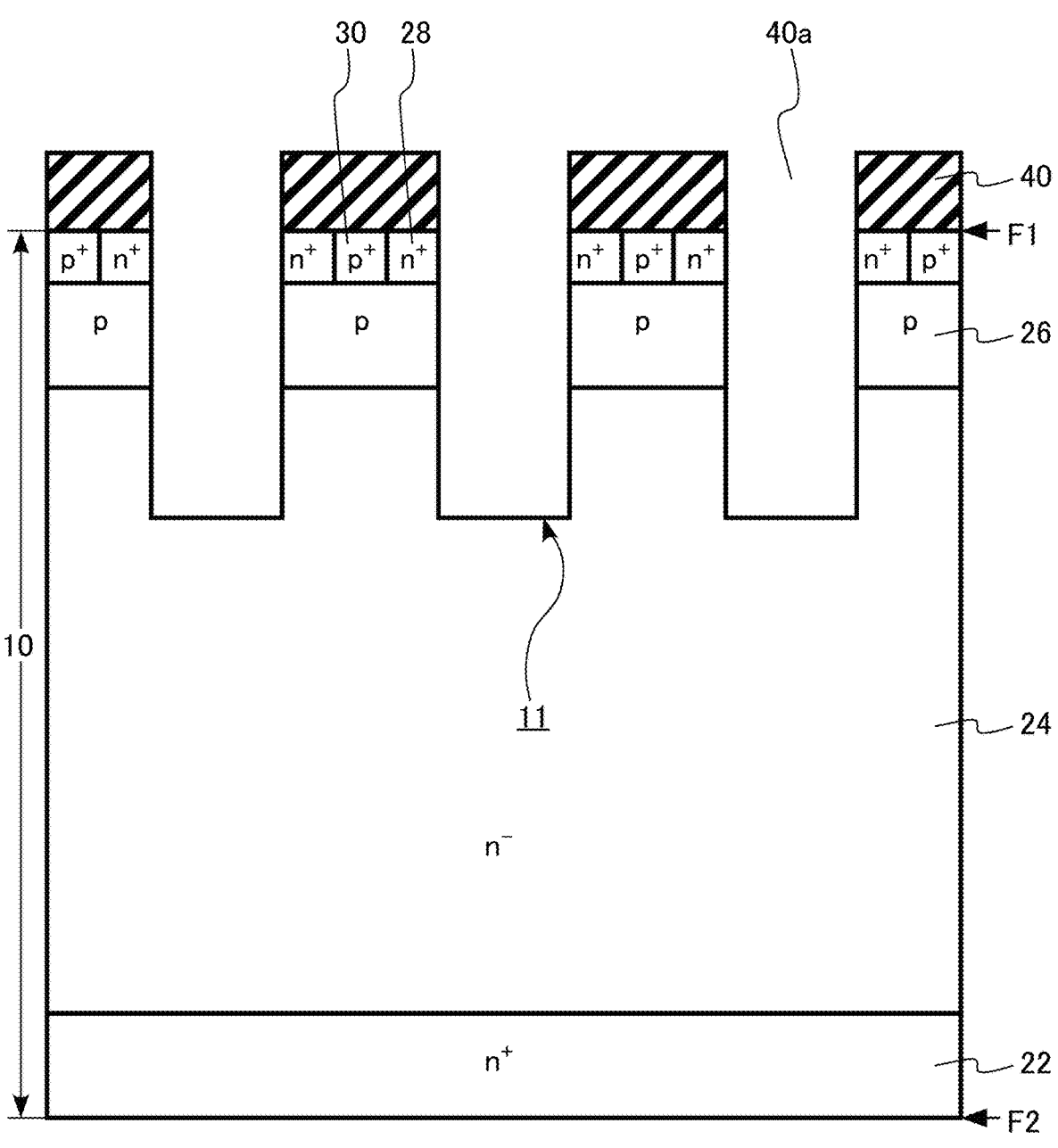
FIG. 6 is an explanatory diagram of the method of manufacturing the semiconductor device according to the first embodiment.

Next, the trench 11 is formed in the silicon carbide layer 10 using the mask material 40 as an etching mask (FIG. 6). The trench 11 is formed by, for example, reactive ion etching (RIE).

Figure 7:
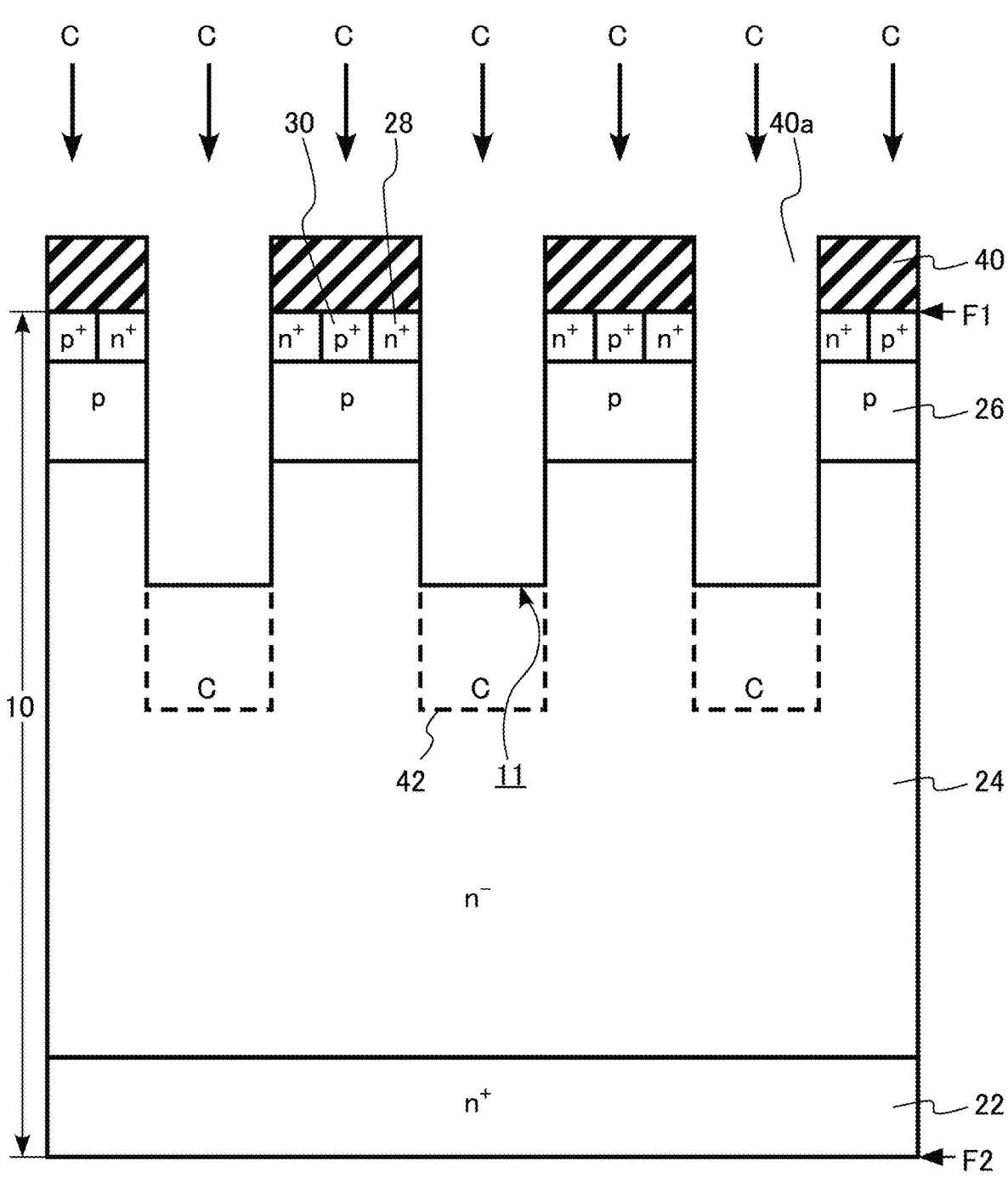
FIG. 7 is an explanatory diagram of the method of manufacturing the semiconductor device according to the first embodiment.

Next, first ion implantation for implanting carbon (C) into the bottom face of the trench 11 is performed using the mask material 40 as an ion implantation mask (FIG. 7). A carbon region 42 is formed in the silicon carbide layer 10 by the first ion implantation.

The first ion implantation is performed, for example, at a temperature of 1000° C. or more and 1300° C. or less. The first ion implantation is performed, for example, in a state where the temperature of the silicon carbide layer 10 is 1000° C. or more and 1300° C. or less.

Next, a sidewall material 44 is formed on the side face of the trench 11. The sidewall material 44 is, for example, an insulator. The sidewall material 44 is, for example, silicon oxide.

The bottom face of the trench 11 is exposed at the bottom of the sidewall material 44. The sidewall material 44 is formed by, for example, deposition of an insulating film and etching using a RIE method.

Figure 8:
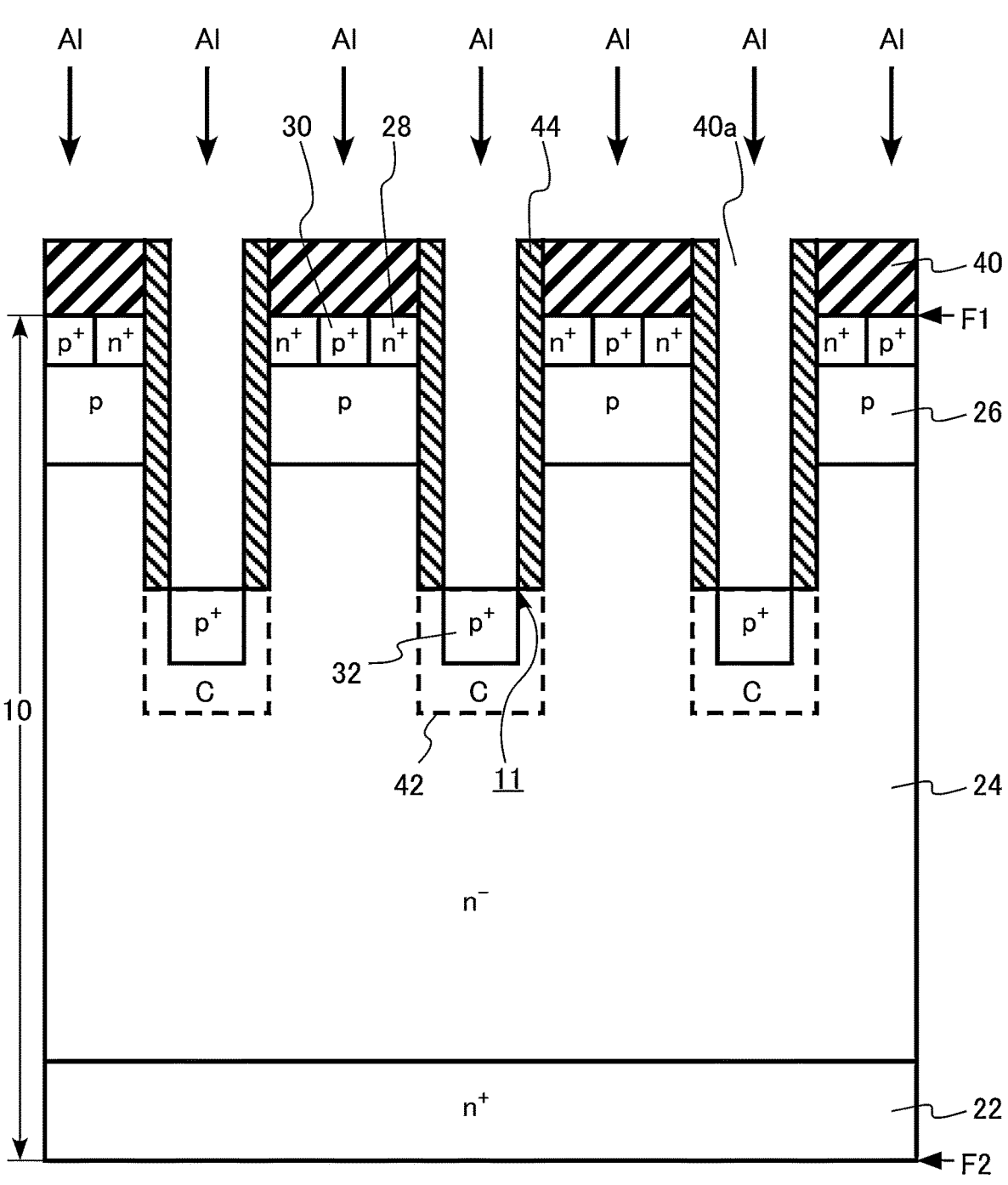
FIG. 8 is an explanatory diagram of the method of manufacturing the semiconductor device according to the first embodiment.

Next, second ion implantation for implanting aluminum (Al) into the bottom face of the trench 11 is performed using the mask material 40 and the sidewall material 44 as ion implantation masks (FIG. 8). The p$^+$-type electric field relaxation region 32 is formed by the second ion implantation. Aluminum (Al) implanted by the second ion implantation is an example of a first impurity.

The second ion implantation is performed, for example, at a temperature of 1000° C. or more and 1300° C. or less. The second ion implantation is performed, for example, in a state where the temperature of the silicon carbide layer 10 is 1000° C. or more and 1300° C. or less.

The maximum concentration of carbon in the silicon carbide layer 10 implanted by the first ion implantation is higher than the maximum concentration of aluminum in the silicon carbide layer 10 implanted by the second ion implantation, for example.

The dose amount of carbon in the first ion implantation is, for example, 10 times or more the dose amount of aluminum in the second ion implantation. In order to prevent diffusion of impurities into the outer region of the electric field relaxation region 32, the dose amount of carbon in the first ion implantation implanted into a carbon region 42 is more than 10 times, preferably 100 times or more, and more preferably 1000 times or more the amount of carbon deficiency in the drift region 24.

The amount of carbon deficiency in the drift region 24 formed by epitaxial growth is estimated to be $1 \times 10^{14}$ cm$^{-3}$ or less. Therefore, the dose amount of carbon in the first ion implantation is $1 \times 10^{15}$ cm$^{-3}$ or more, preferably $1 \times 10^{16}$ cm$^{-3}$ or more, and more preferably $1 \times 10^{17}$ cm$^{-3}$ or more.

For example, the distribution of carbon implanted into the silicon carbide layer 10 by the first ion implantation in the silicon carbide layer 10 before the heat treatment covers the distribution of aluminum implanted into the silicon carbide layer 10 by the second ion implantation in the silicon carbide layer 10 before the heat treatment. For example, the distribution of aluminum (Al) implanted by the second ion implantation in the silicon carbide layer 10 is included in the carbon region 42, for example, as illustrated in FIG. 8.

Next, the mask material 40 and the sidewall material 44 are removed. The mask material 40 and the sidewall material 44 are removed by, for example, etching using a wet etching method.

Next, a carbon film 46 is formed on the surface of the silicon carbide layer 10.

Figure 9:
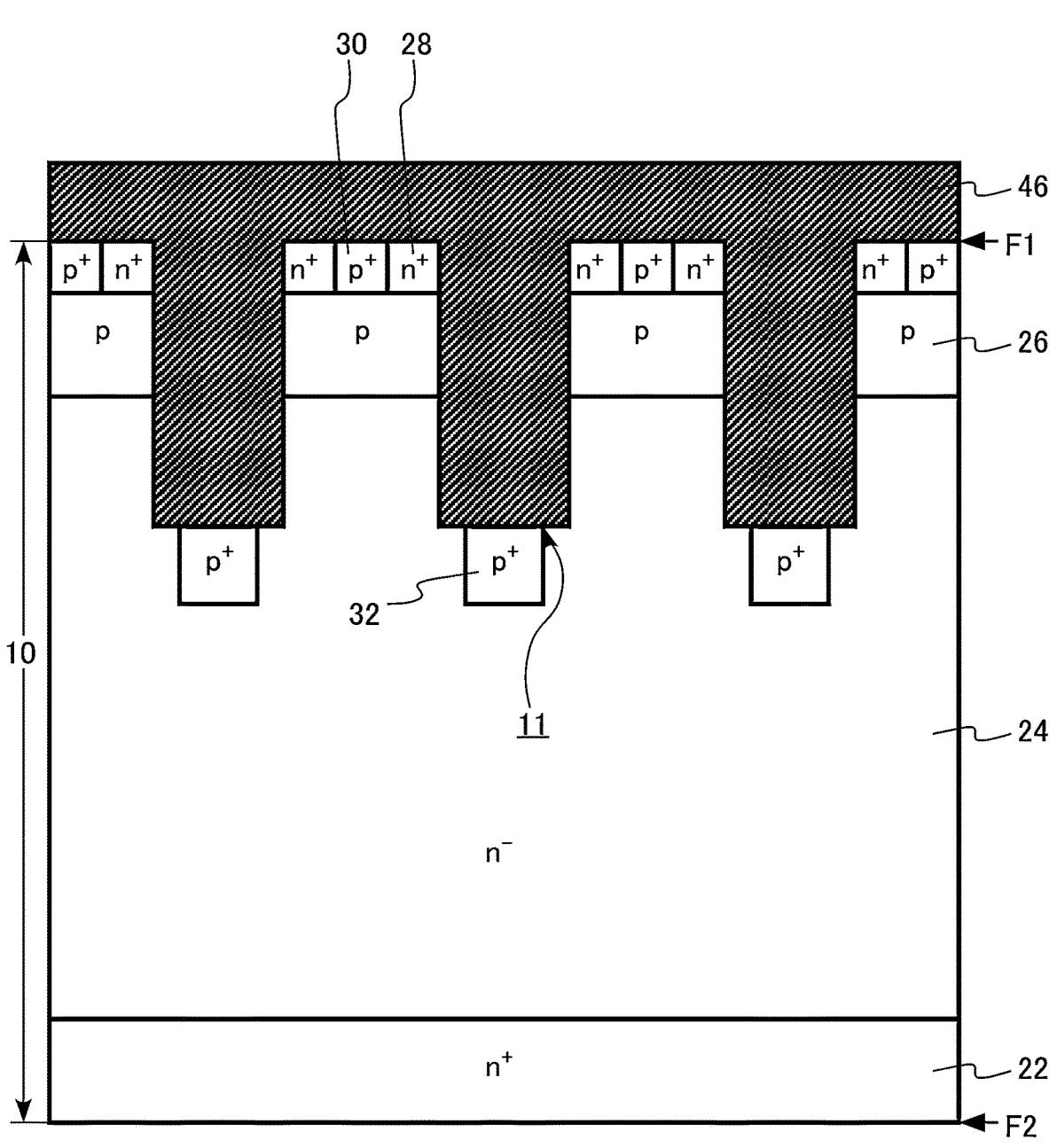
FIG. 9 is an explanatory diagram of the method of manufacturing the semiconductor device according to the first embodiment.

Next, heat treatment is performed (FIG. 9). The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum ion-implanted into the silicon carbide layer 10. The heat treatment is activation annealing of aluminum. Further, interstitial carbon formed by carbon ion implantation into the silicon carbide layer 10 by heat treatment fills carbon vacancies in the silicon carbide layer 10.

The carbon film 46 suppresses desorption of silicon and carbon from the silicon carbide layer 10 into the atmosphere during the heat treatment. Further, the carbon film 46 absorbs excessive interstitial carbon in the silicon carbide layer 10 during the heat treatment.

Figure 10:
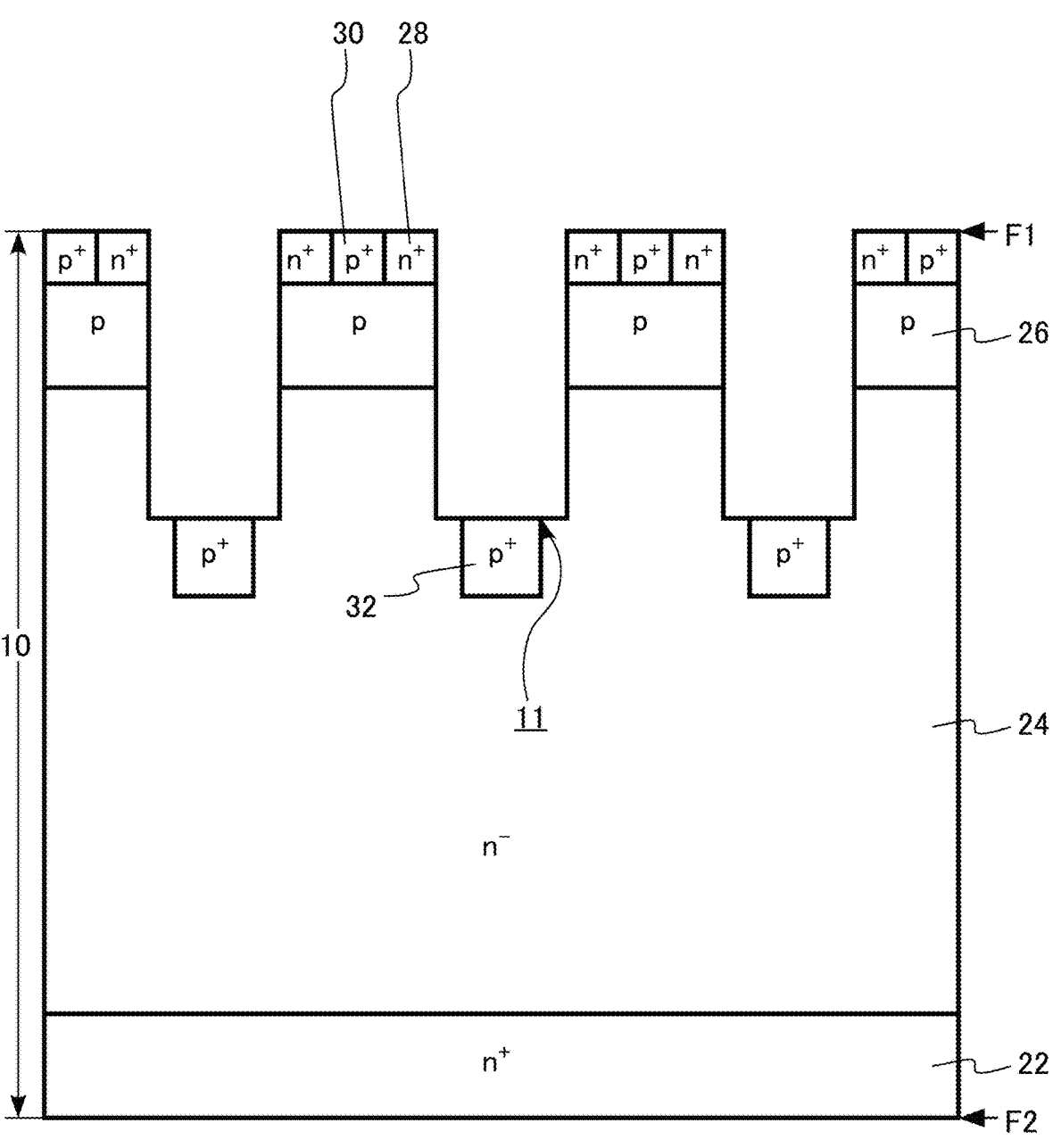
FIG. 10 is an explanatory diagram of the method of manufacturing the semiconductor device according to the first embodiment.

Next, the carbon film 46 is removed (FIG. 10). Thereafter, the gate insulating layer 14 and the gate electrode 12 are formed inside the trench 11 using a known process technique. Further, the interlayer insulating layer 20 and the source electrode 16 are formed on the surface of the silicon carbide layer 10. Further, the drain electrode 18 is formed on the back surface of the silicon carbide layer 10.

The MOSFET 100 illustrated in FIGS. 1 and 2 is manufactured by the above manufacturing method.

Next, functions and effects of the semiconductor device and the semiconductor device manufacturing method according to the first embodiment will be described.

According to the MOSFET 100 of the first embodiment, it is possible to reduce the on-resistance and improve the reliability. The details will be described below.

A trench gate structure in which a gate electrode is provided in a trench is applied to the MOSFET 100. By applying the trench gate structure, the channel area per unit area is increased and the on-resistance of the MOSFET 100 is reduced. For example, if the MOSFET 100 is scaled-down by reducing the trench width and the repetition pitch of the trenches, the on-resistance of the MOSFET 100 can be further reduced.

In addition, the MOSFET 100 has the electric field relaxation region 32 at the bottom of the trench 11. By having the electric field relaxation region 32, the electric field applied to the gate insulating layer 14 at the bottom of the trench 11 is relaxed when the MOSFET 100 is turned off. Therefore, the reliability of the gate insulating layer 14 is improved.

Figure 11:
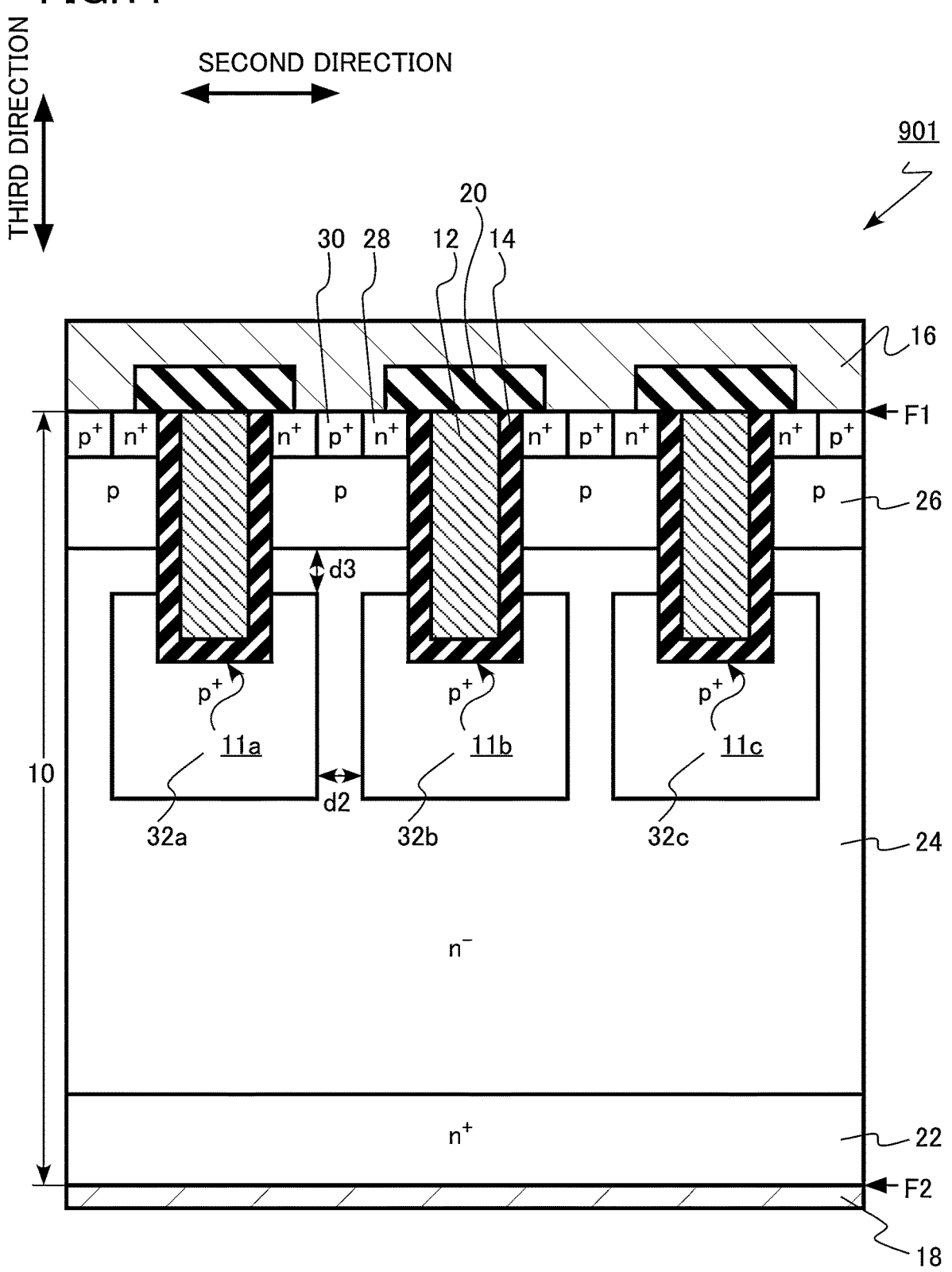
FIG. 11 is a schematic cross-sectional view of a semiconductor device of a first comparative example.

FIG. 11 is a schematic cross-sectional view of a semiconductor device of a first comparative example. The semiconductor device of the first comparative example is a trench gate type vertical MOSFET 901 using silicon carbide. The MOSFET 901 is an n-channel MOSFET using electrons as carriers.

The MOSFET 901 of the first comparative example is a MOSFET manufactured by a manufacturing method different from the method of manufacturing the semiconductor device according to the first embodiment. The MOSFET 901 of the first comparative example is manufactured without performing the first ion implantation included in the method of manufacturing the semiconductor device according to the first embodiment. In the first ion implantation, carbon (C) is implanted into the bottom face of the trench.

In the MOSFET 901 of the first comparative example, a distance (d2 in FIG. 11) in the second direction between the adjacent electric field relaxation regions 32 is smaller than that of the MOSFET 100 of the first embodiment. In addition, in the MOSFET 901 of the first comparative example, a third distance (d3 in FIG. 11) in the third direction between the electric field relaxation region 32 and the body region 26 is smaller than that of the MOSFET 100 of the first embodiment.

When the distance d2 in the second direction between the adjacent electric field relaxation regions 32 decreases, the current path flowing through the drift region 24 is narrowed during the on-operation of the MOSFET. In addition, when the third distance d3 in the third direction between the electric field relaxation region 32 and the body region 26 decreases, the current path flowing through the drift region 24 is narrowed during the on-operation of the MOSFET.

Therefore, the on-resistance of the MOSFET increases. In addition, when Al in the electric field relaxation region 32 diffuses and reaches the body region 26, that is, when the third distance d3 becomes 0, the operation of the MOSFET becomes difficult.

In addition, when the third distance d3 in the third direction between the electric field relaxation region 32 and the body region 26 decreases, the threshold voltage of the MOSFET may fluctuate due to the fluctuation of the third distance d3.

For example, if the diffusion of aluminum in the electric field relaxation region 32 can be suppressed, the distance d2 in the second direction between the adjacent electric field relaxation regions 32 and the third distance d3 in the third direction between the electric field relaxation region 32 and the body region 26 increase, and the on-resistance of the MOSFET can be reduced.

In the method of manufacturing the semiconductor device according to the first embodiment, carbon (C) is introduced into a range wider than a range in which impurities are ion-implanted by ion implantation. By the above method, the density of carbon vacancies in the silicon carbide layer 10 is reduced, and diffusion of impurities ion-implanted into the silicon carbide layer 10 due to heat treatment can be suppressed.

Diffusion of impurities in the silicon carbide layer 10 is promoted by the carbon vacancies in the silicon carbide layer 10. In the method of manufacturing the semiconductor device according to the first embodiment, the carbon region 42 is formed by ion implantation of carbon, so that the carbon vacancy density in the silicon carbide layer 10 is reduced. Therefore, diffusion of impurities is suppressed, and the diffusion of aluminum in the electric field relaxation region 32 can be suppressed.

In particular, in the method of manufacturing the semiconductor device according to the first embodiment, carbon is ion-implanted into the bottom face of the trench 11 by the first ion implantation to form the carbon region 42, and then the second ion implantation is performed using the sidewall material 44 as a mask to ion-implant aluminum into the bottom face of the trench 11. Therefore, at least in the second direction, the distribution of aluminum is covered with the carbon region 42.

In the method of manufacturing the semiconductor device according to the first embodiment, the carbon region 42 is formed in a region where diffusion of aluminum in the lateral direction is scheduled before the heat treatment for diffusing aluminum. Therefore, diffusion of aluminum in the lateral direction is effectively suppressed.

Therefore, according to the method of manufacturing the semiconductor device of the first embodiment, as compared with the MOSFET 901 of the first comparative example, the MOSFET 100 in which the second distance d2 in the second direction between the adjacent electric field relaxation regions 32 and the third distance d3 in the third direction between the electric field relaxation region 32 and the body region 26 are large can be manufactured. Therefore, the MOSFET 100 that can reduce the on-resistance can be manufactured. Further, in the MOSFET 100, the third distance d3 in the third direction between the electric field relaxation region 32 and the body region 26 increases, so that the fluctuation of the threshold voltage is suppressed.

In addition, since the diffusion of aluminum in the electric field relaxation region 32 can be suppressed, the p-type impurity concentration of the electric field relaxation region 32 can be increased. Therefore, the electric resistance of the electric field relaxation region 32 is reduced. Therefore, for example, when the MOSFET 100 is turned off, the discharge of holes from the electric field relaxation region 32 is promoted. Therefore, the switching loss of the MOSFET 100 can be reduced. Although the electric field relaxation region 32 is connected to the source electrode 16 at any position in the first direction, the p-type impurity concentration of the electric field relaxation region 32 can be increased, so that a wide interval can be provided until the source electrode 16 is connected.

In addition, by increasing the p-type impurity concentration of the electric field relaxation region 32, the electric field applied to the gate insulating layer 14 at the bottom of the trench 11 is further relaxed when the MOSFET 100 is turned off. Therefore, the reliability of the gate insulating layer 14 of the MOSFET 100 is further improved.

The first ion implantation for implanting carbon is preferably performed at a temperature of 1000° C. or more. By introducing carbon into the silicon carbide layer 10 at a temperature of 1000° C. or more, interstitial carbon enters carbon vacancies during ion implantation, and the carbon vacancy density can be reduced. Therefore, for example, diffusion of impurities when the subsequent ion implantation of impurities is performed at a high temperature can be suppressed.

In addition, ion implantation of carbon at a temperature of 1000° C. or more can reduce damage due to the ion implantation of carbon. Therefore, the characteristics of the MOSFET 100 are improved.

The second ion implantation for implanting aluminum (Al) is preferably performed at a temperature of 1000° C. or more. Impurity ion implantation at a temperature of 1000° C. or more can reduce damage due to the impurity ion implantation. Since amorphization of the silicon carbide layer 10 due to damage can be suppressed and the crystallinity can be kept high, the activation efficiency after the activation annealing can be increased. Since the crystallinity of the silicon carbide layer 10 can be maintained higher as the temperature of ion implantation is higher, the temperature of ion implantation is more preferably 1100° C. or more.

From the viewpoint of suppressing degradation of the mask material 40 and the sidewall material 44 due to heat, the temperatures of the first ion implantation and the second ion implantation are preferably 1300° C. or less, and more preferably 1200° C. or less.

Since the carbon region 42 is formed by the first ion implantation of carbon prior to the second ion implantation of aluminum, diffusion of impurities due to ion implantation at a high temperature can be suppressed.

From the viewpoint of suppressing the diffusion of aluminum, the maximum concentration of carbon in the silicon carbide layer 10 implanted by the first ion implantation is preferably higher than the maximum concentration of aluminum in the silicon carbide layer 10 implanted by the second ion implantation.

From the viewpoint of suppressing the diffusion of aluminum, the dose amount of carbon in the first ion implantation is preferably 10 times or more, more preferably 100 times or more the dose amount of aluminum in the second ion implantation.

From the viewpoint of suppressing the diffusion of aluminum, the distribution of carbon implanted into the silicon carbide layer 10 by the first ion implantation in the silicon carbide layer 10 before the heat treatment preferably covers the distribution of aluminum implanted into the silicon carbide layer 10 by the second ion implantation in the silicon carbide layer 10 before the heat treatment.

The temperature of the heat treatment is preferably 1850° C. or more. When the heat treatment is performed at 1850° C. or more, the activation rate of impurities is improved. Since the carbon region 42 is formed by the first ion implantation of carbon prior to the second ion implantation of aluminum, the diffusion of aluminum can be suppressed even when the heat treatment is performed at 1850° C. or more.

In the MOSFET 100 of the first embodiment, the first distance (d1 in FIGS. 1 and 2) between two adjacent trenches 11 is 1.0 μm or less. The second distance (d2 in FIG. 1) between the two adjacent electric field relaxation regions 32 is ½ or more of the first distance (d1 in FIGS. 1 and 2) between the two adjacent trenches 11.

Although the first distance d1 between the two adjacent trenches 11 is as small as 1.0 μm or less, the distance d2 between the two adjacent electric field relaxation regions 32 is large, and the current path is not narrowed. Therefore, the on-resistance of the MOSFET 100 can be reduced. In the MOSFET 901 of the first comparative example, it is difficult to set the first distance d1 to 1.0 μm or less.

Further, in the MOSFET 100 of the first embodiment, the p-type impurity concentration of the electric field relaxation region 32 is higher than $1\times10^{20}$ cm$^{-3}$. Therefore, the switching loss of the MOSFET 100 is reduced. In addition, the reliability of the gate insulating layer 14 is improved.

In addition, the third distance (d3 in FIG. 1) in the third direction between the electric field relaxation region 32 and the body region 26 is larger than the third distance (d3 in FIG. 11) of the MOSFET 901 of the first comparative example. Therefore, the current path is not narrowed, and the on-resistance of the MOSFET 100 can be reduced. In addition, the threshold voltage of the MOSFET 100 due to the fluctuation of the third distance d3 is suppressed.

From the viewpoint of reducing the on-resistance of the MOSFET 100, the first distance d1 between the two adjacent trenches 11 is preferably 0.8 μm or less, and more preferably 0.6 μm or less.

From the viewpoint of reducing the on-resistance of the MOSFET 100, the second distance d2 between the two adjacent electric field relaxation regions 32 is preferably ⅔ or more of the first distance d1 between the two adjacent trenches 11, more preferably ⅘ or more of the first distance d1, and still more preferably the first distance d1 or more.

From the viewpoint of reducing the switching loss of the MOSFET 100 and improving the reliability of the gate insulating layer 14, the p-type impurity concentration of the electric field relaxation region 32 is preferably $5\times10^{20}$ cm$^{-3}$ or more, and more preferably $1\times10^{21}$ cm$^{-3}$ or more.

Modified Example

A method of manufacturing a semiconductor device of a modification of the first embodiment is different from the method of manufacturing a semiconductor device according to the first embodiment in that third ion implantation for implanting carbon (C) into a bottom face of a trench is performed using a sidewall material as a mask after forming the sidewall material and before heat treatment.

In the method of manufacturing the semiconductor device of the modification, for example, before second ion implantation for implanting aluminum (Al) into the bottom face of the trench 11 is performed using the mask material 40 and the sidewall material 44 as ion implantation masks, the third ion implantation for implanting carbon (C) into the bottom face of the trench 11 is performed using the mask material 40 and the sidewall material 44 as ion implantation masks.

The dose amount of carbon (C) implanted by the third ion implantation is, for example, higher than the dose amount of carbon (C) implanted by the second ion implantation.

In the method of manufacturing the semiconductor device of the modification, the diffusion of aluminum in the electric field relaxation region 32 can be further suppressed by performing the third ion implantation for implanting carbon (C).

As described above, according to the method of manufacturing the semiconductor device and the semiconductor device of the first embodiment and the modification, it is possible to reduce the on-resistance.

Second Embodiment

A method of manufacturing a semiconductor device according to a second embodiment includes: forming a first mask material having an opening on a surface of a silicon carbide layer; forming a trench having a first side face and a second side face and extending in a first direction parallel to the surface in the silicon carbide layer using the first mask material as a mask; performing first ion implantation for implanting carbon (C) into the second side face of the trench using the first mask material as a mask; performing second ion implantation for implanting a p-type first impurity into the second side face of the trench using the first mask material as a mask; performing third ion implantation for implanting carbon (C) into a bottom face of the trench using the first mask material as a mask; forming a sidewall material on the first side face and the second side face of the trench; performing fourth ion implantation for implanting a p-type second impurity into the bottom face of the trench using the sidewall material as a mask; and performing heat treatment at 1600° C. or more. The method of manufacturing the semiconductor device according to the second embodiment is different from the method of manufacturing the semiconductor device according to the first embodiment in that the first ion implantation for implanting carbon (C) into the second side face of the trench is performed using the first mask material as a mask, and the second ion implantation for implanting a p-type first impurity into the second side face of the trench is performed using the first mask material as a mask. Hereinafter, a part of the description overlapping with that of the first embodiment may be omitted.

Further, the semiconductor device according to the second embodiment is different from the semiconductor device according to the first embodiment in further including a plurality of p-type sixth silicon carbide regions that are disposed in the silicon carbide layer, are in contact with the fourth silicon carbide region, are disposed between the first silicon carbide region and the first trench, between the second silicon carbide region and the first trench, and between the third silicon carbide region and the first trench, and are repeatedly arranged in the first direction. Hereinafter, a part of the description overlapping with that of the first embodiment may be omitted.

Figure 12:
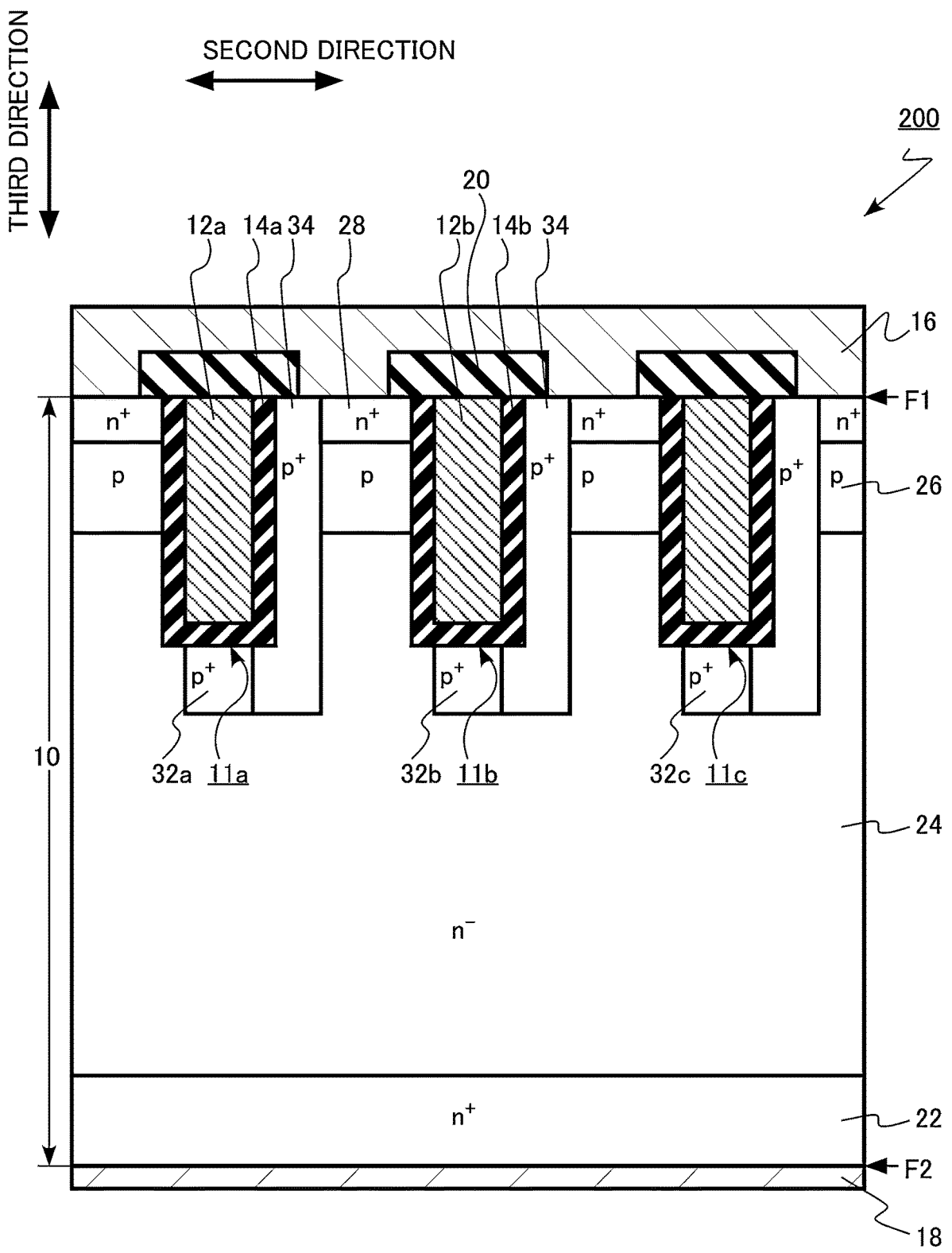
FIG. 12 is a schematic cross-sectional view of a semiconductor device according to a second embodiment.
Figure 13:
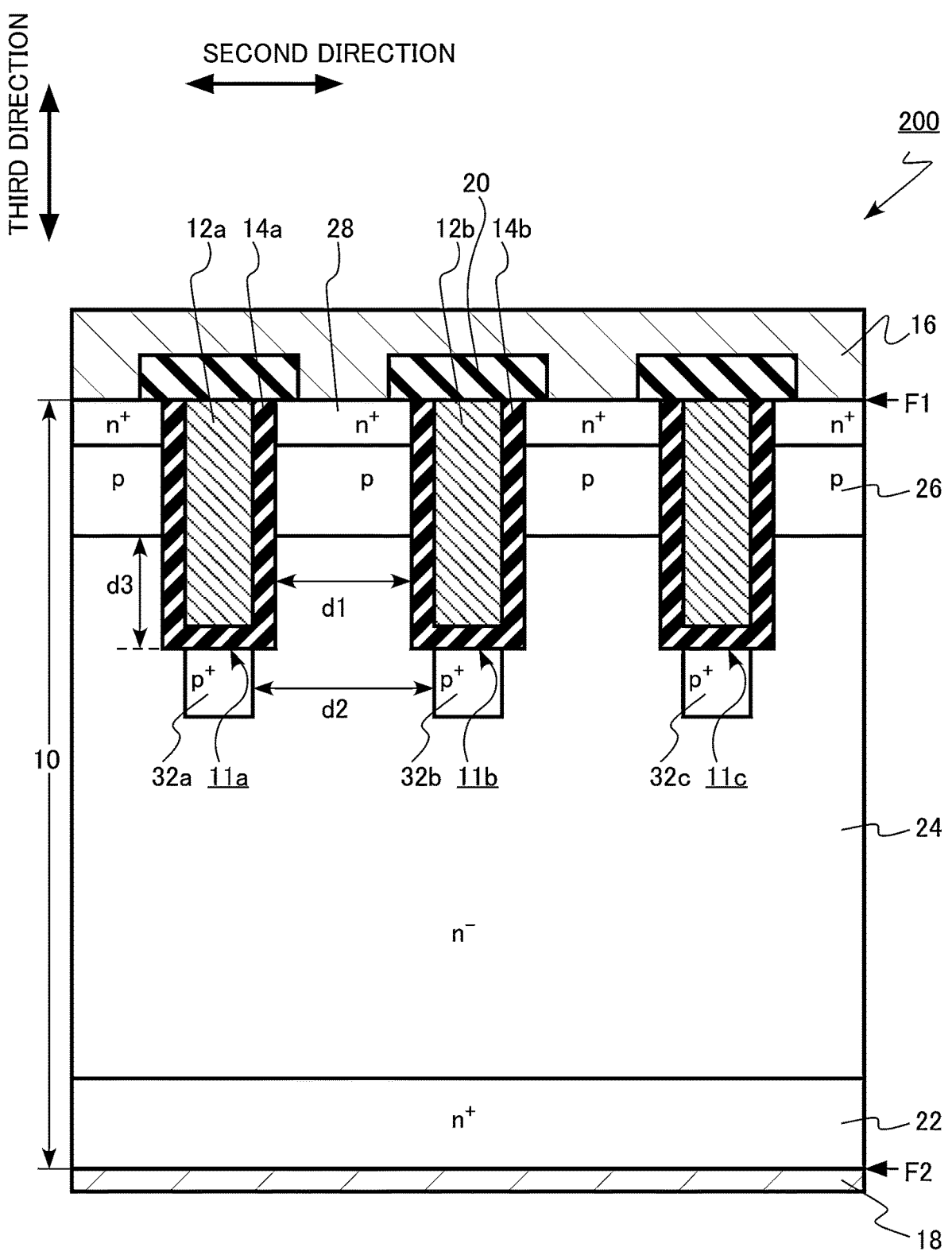
FIG. 13 is a schematic cross-sectional view of the semiconductor device according to the second embodiment.

FIGS. 12 and 13 are schematic cross-sectional views of the semiconductor device according to the second embodiment. The semiconductor device according to the first embodiment is a trench gate type vertical MOSFET 200 using silicon carbide. The MOSFET 200 is an n-channel MOSFET using electrons as carriers.

Figure 14:
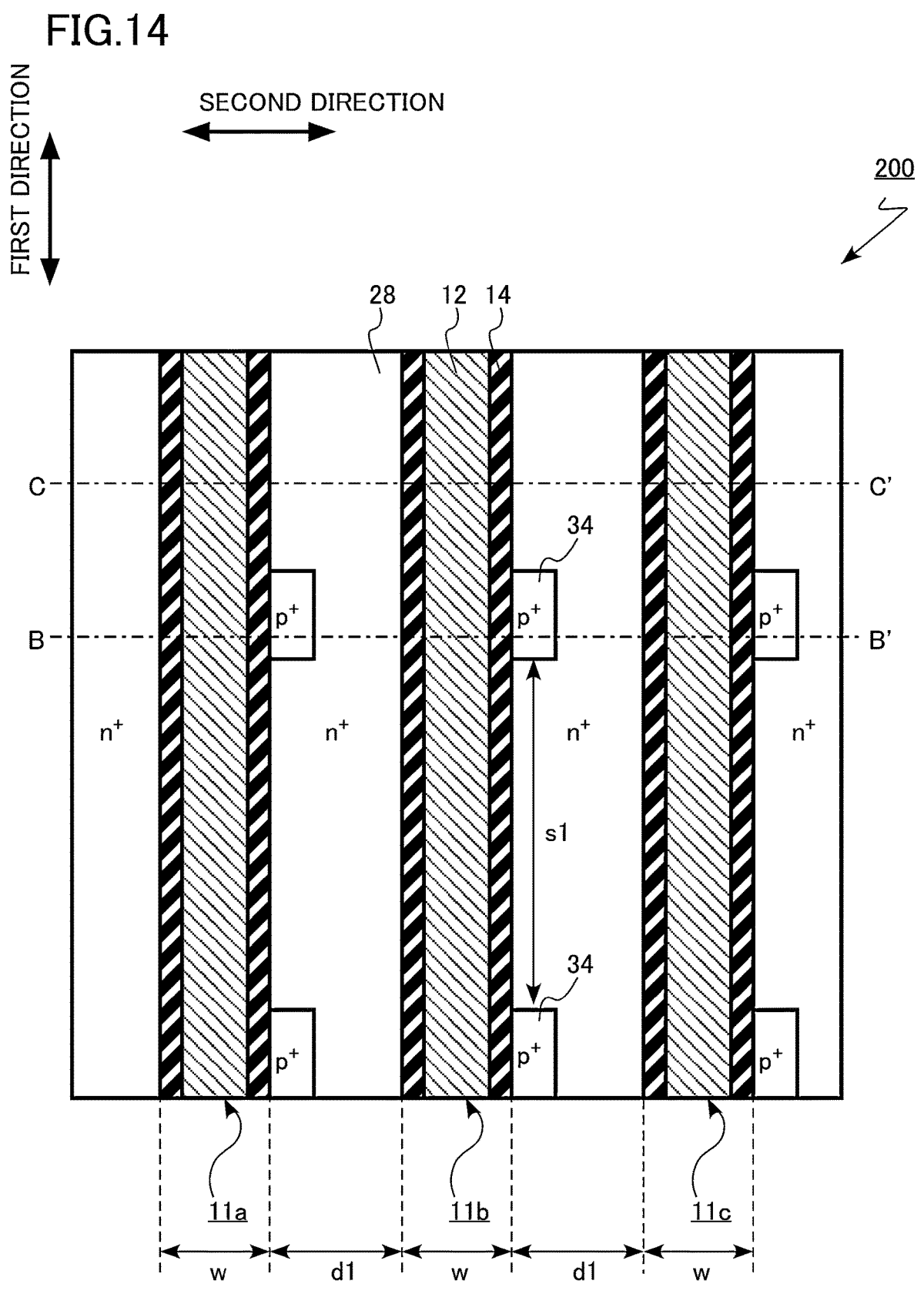

FIG. 14 is a schematic plan view of the semiconductor device according to the second embodiment.

FIG. 14 is a plan view of a first face (F1 in FIGS. 12 and 13) in FIGS. 12 and 13. The first direction and the second direction are directions parallel to a first face F1.

Further, the second direction is a direction perpendicular to the first direction. FIG. 12 is a cross section taken along line BB' in FIG. 14. FIG. 13 is a cross section taken along line CC' in FIG. 14.

The MOSFET 200 includes a silicon carbide layer 10, a first trench 11a, a second trench 11b, a third trench 11c, a first gate electrode 12a, a second gate electrode 12b, a third gate electrode 12c, a first gate insulating layer 14a, a second gate insulating layer 14b, a third gate insulating layer 14c, a source electrode 16 (first electrode), a drain electrode 18 (second electrode), and an interlayer insulating layer 20.

Hereinafter, the first trench 11a, the second trench 11b, and the third trench 11c may be collectively referred to as a trench 11. Hereinafter, the first gate electrode 12a, the second gate electrode 12b, and the third gate electrode 12c may be collectively referred to as a gate electrode 12. Hereinafter, the first gate insulating layer 14a, the second gate insulating layer 14b, and the third gate insulating layer 14c may be collectively referred to as a gate insulating layer 14.

In the silicon carbide layer 10, an n+-type drain region 22, an n−-type drift region 24 (first silicon carbide region), a p-type body region 26 (second silicon carbide region), an n+-type source region 28 (third silicon carbide region), a p+-type first electric field relaxation region 32a (fourth silicon carbide region), a p+-type second electric field relaxation region 32b (fifth silicon carbide region), and a p+-type connection region 34 (sixth silicon carbide region) are provided.

Hereinafter, the first electric field relaxation region 32a, the second electric field relaxation region 32b, and the third electric field relaxation region 32c may be collectively referred to as an electric field relaxation region 32.

A width (w in FIG. 14) of the trench 11 in the second direction is, for example, equal to or less than a first distance (d1 in FIGS. 13 and 14) between two adjacent trenches 11.

The width (w in FIG. 14) of the trench 11 in the second direction is, for example, 0.2 μm or more and 1.0 μm or less.

The first distance d1 between the two adjacent trenches 11 is 1.0 μm or less. The first distance d1 between the two adjacent trenches 11 is, for example, 0.2 μm or more and 1.0 μm or less. For example, the first distance d1 between the first trench 11a and the second trench 11b is 0.2 μm or more and 1.0 μm or less. Since the diffusion of aluminum from the electric field relaxation region 32 can be suppressed, the first distance d1 between the two adjacent trenches 11 can be decreased.

The trenches 11 are repeatedly arranged in the second direction. The repetition pitch of the trenches 11 in the second direction is, for example, 0.4 μm or more and 2.0 μm or less.

The depth of the trench 11 is, for example, 0.5 μm or more and 2 μm or less.

Since the diffusion of aluminum in the electric field relaxation region 32 can be suppressed, the third distance d3 can be reduced, and the depth of the trench 11 can be decreased.

The inclination angle of the side face of the trench 11 with respect to the m-face or the a-face is, for example, 0 degrees or more and 5 degrees or less.

The p+-type connection region 34 is in contact with the electric field relaxation region 32. The connection region 34 is provided between the drift region 24 and the trench 11. The connection region 34 is provided between the body region 26 and the trench 11. The connection region 34 is provided between the source region 28 and the trench 11.

The p+-type connection region 34 is in contact with the first electric field relaxation region 32a. The connection region 34 is provided between the drift region 24 and the first trench 11a. The connection region 34 is provided between the body region 26 and the first trench 11a. The connection region 34 is provided between the source region 28 and the first trench 11a.

The connection region 34 is in contact with the side face of the trench 11. The connection region 34 is in contact with, for example, the bottom face of the trench 11. The connection region 34 is in contact with the first face F1, for example.

The connection region 34 is in contact with the side face of the first trench 11a. The connection region 34 is in contact with, for example, the bottom face of the first trench 11a.

The connection region 34 is in contact with the gate insulating layer 14. The connection region 34 is in contact with the source electrode 16 on the first face F1, for example.

As illustrated in FIG. 14, the plurality of connection regions 34 are repeatedly arranged in the first direction. An interval between two connection regions 34 adjacent to each other in the first direction is a first interval (s1 in FIG. 14).

The connection region 34 has a function of electrically connecting the electric field relaxation region 32 and the source electrode 16. The electric field relaxation region 32 is fixed to the electric potential of the source electrode 16 by the connection region 34. The electric field relaxation region 32 is fixed to the electric potential by the connection region 34.

In addition, the connection region 34 has a function of reducing electric resistance between the source electrode 16 and the body region 26.

Next, an example of a method of manufacturing the semiconductor device according to the second embodiment will be described.

FIGS. 15, 16, 17, 18, 19, 20, 21, 22, 23, and 24 are explanatory diagrams of the method of manufacturing the semiconductor device according to the second embodiment.

Figure 17:
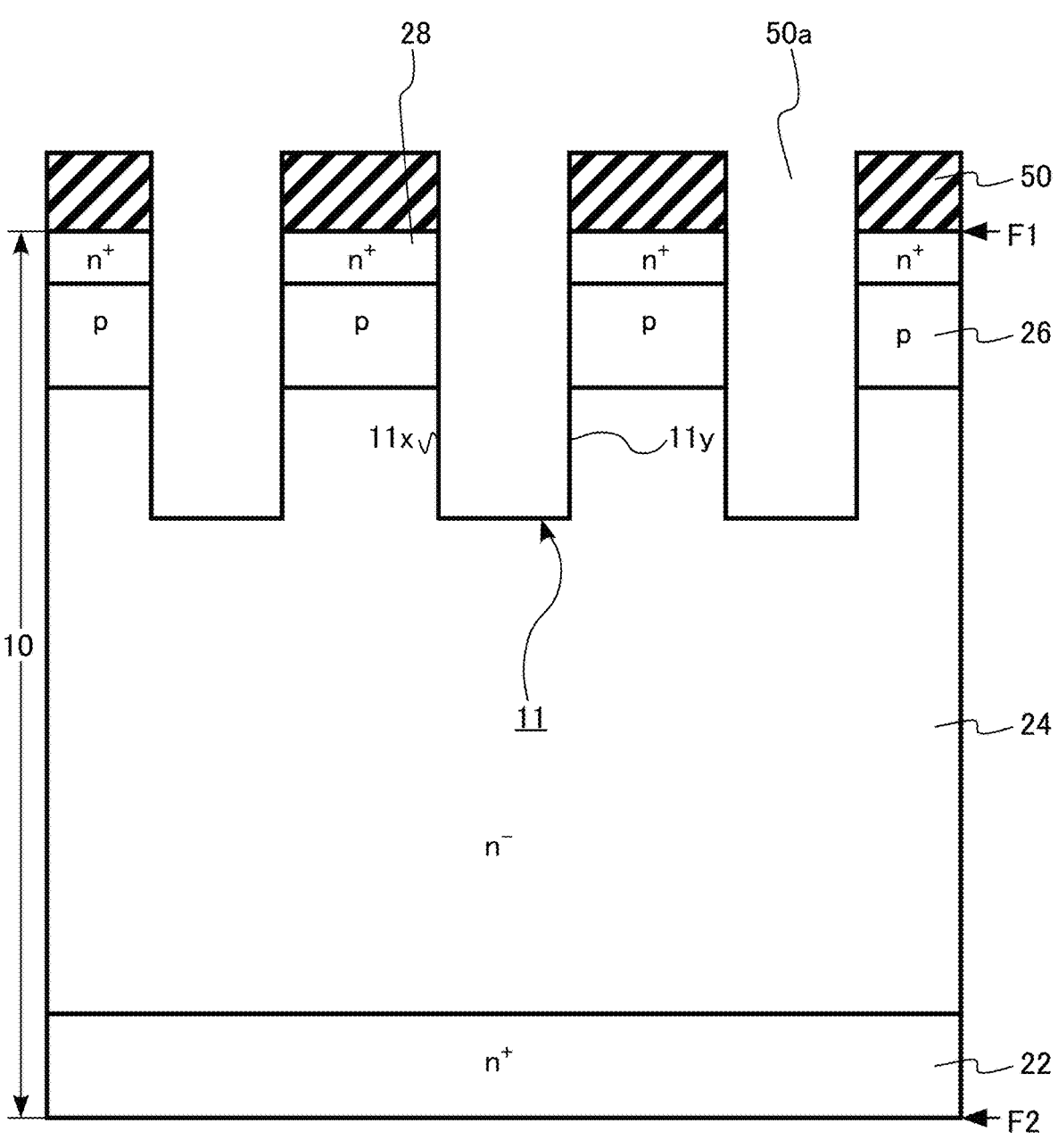
FIG. 17 is an explanatory diagram of the method of manufacturing the semiconductor device according to the second embodiment.
Figure 18:
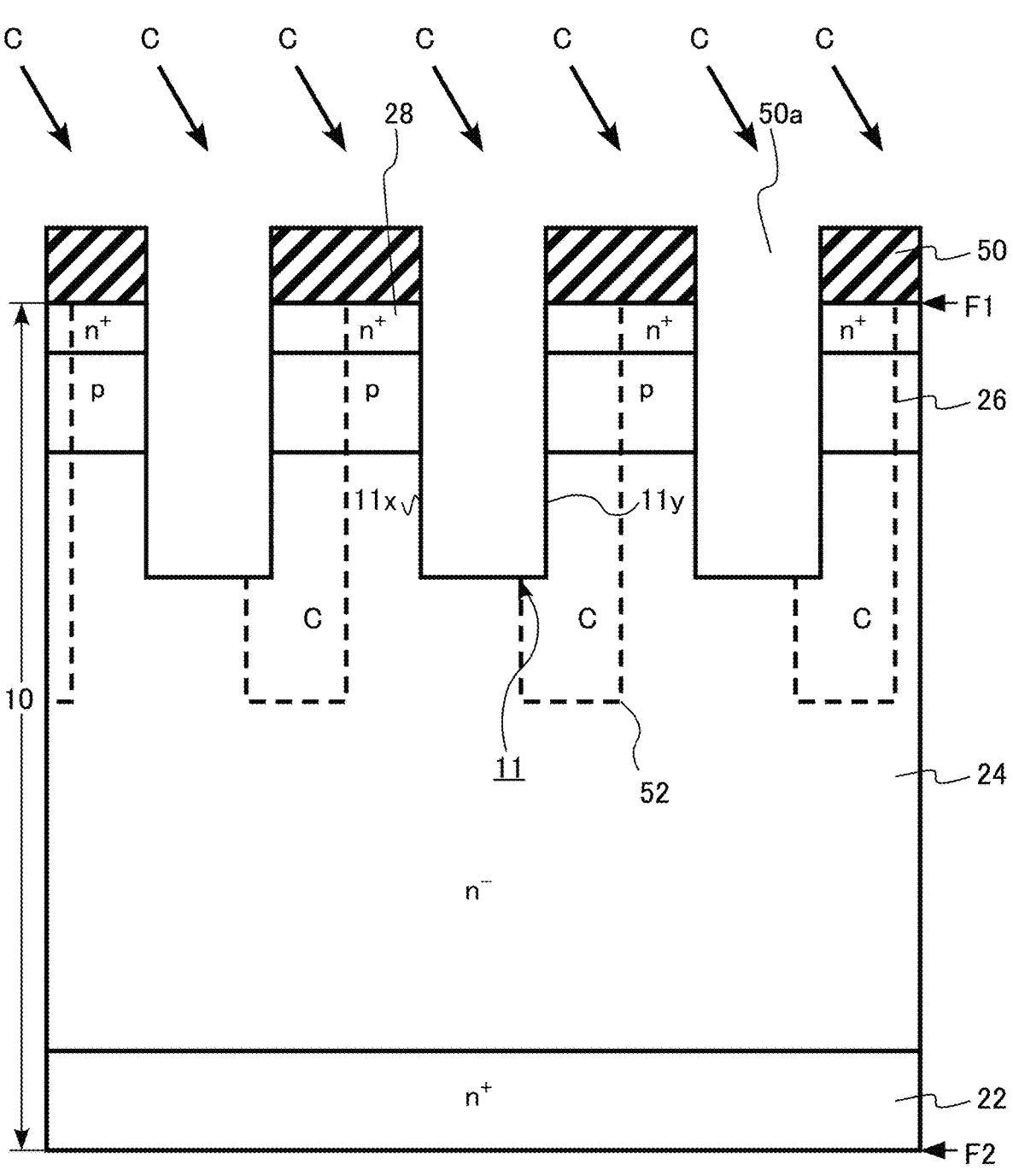
FIG. 18 is an explanatory diagram of the method of manufacturing the semiconductor device according to the second embodiment.
Figure 19:
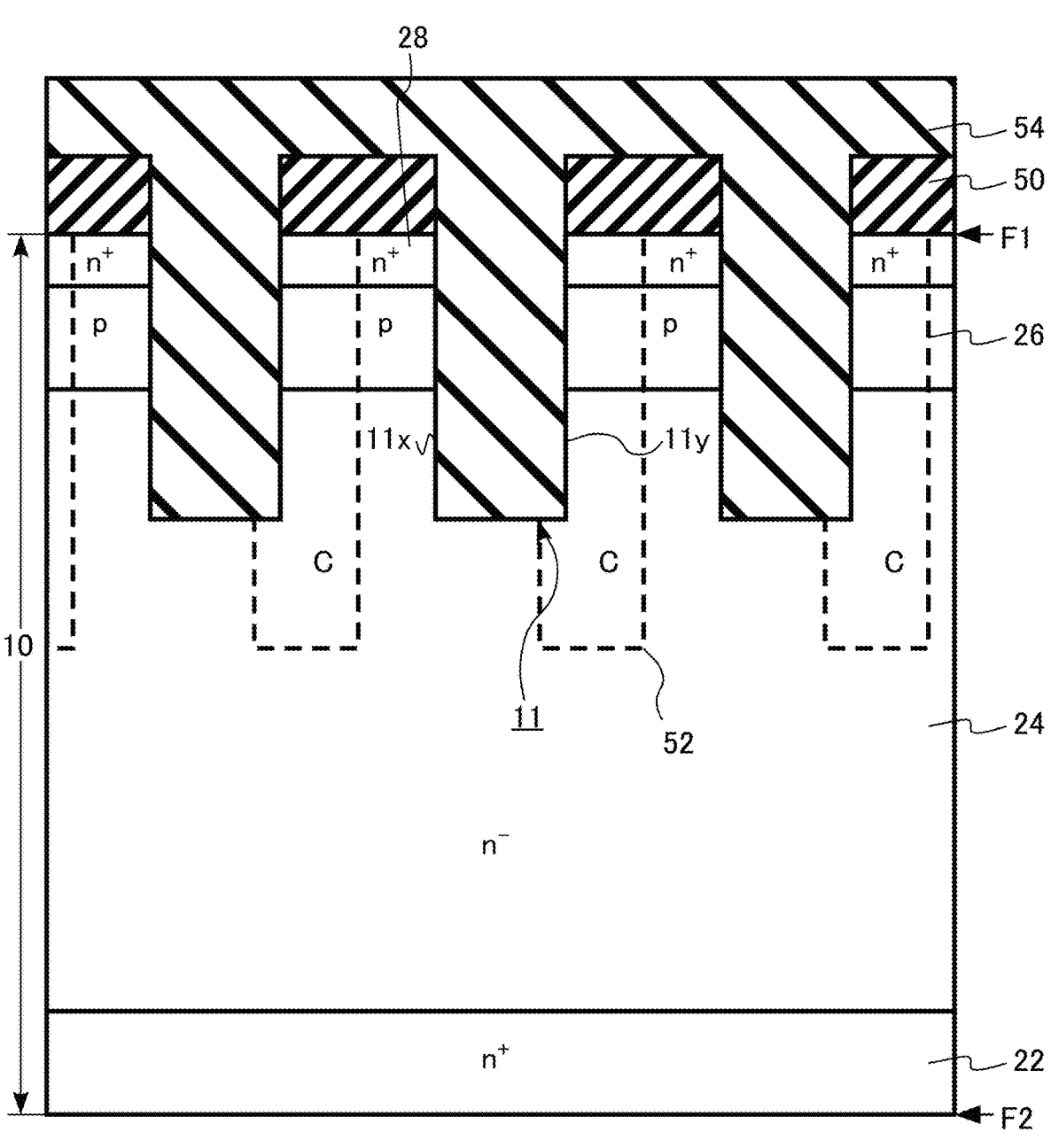
FIG. 19 is an explanatory diagram of the method of manufacturing the semiconductor device according to the second embodiment.

FIGS. 15 to 24 are schematic cross-sectional views illustrating the semiconductor device in the middle of manufacturing. FIGS. 15 to 18 and FIGS. 20 to 24 illustrate cross sections corresponding to FIG. 12. FIG. 19 illustrates cross sections corresponding to FIG. 13.

Figure 15:
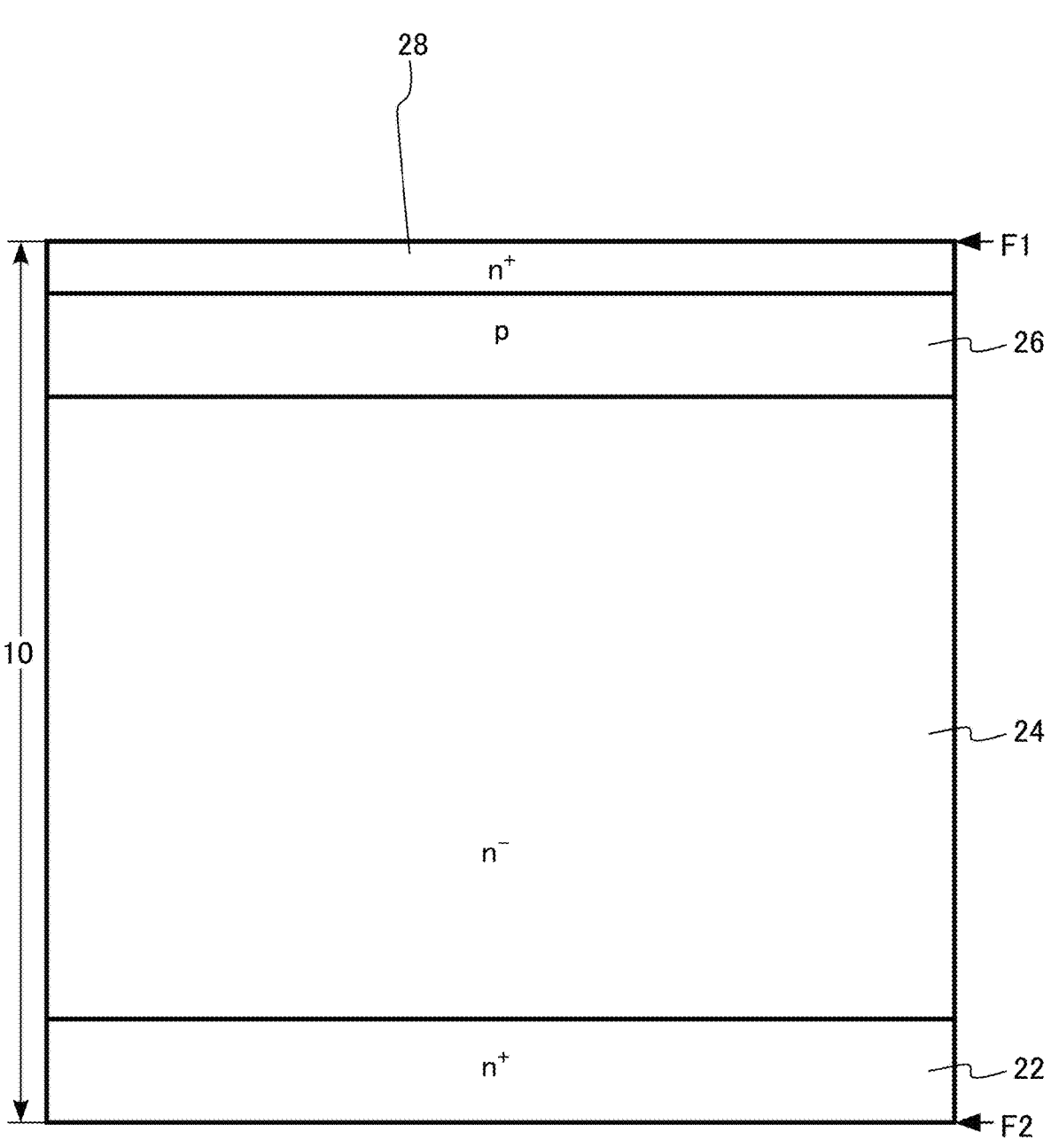
FIG. 15 is an explanatory diagram of a method of manufacturing the semiconductor device according to the second embodiment.

First, the silicon carbide layer 10 having the first face F1 (surface) which is a silicon face and the second face F2 (back surface) which is a carbon face is prepared (FIG. 15). In the silicon carbide layer 10, the n+-type drain region 22, the n−-type drift region 24, the p-type body region 26, and the n+-type source region 28 are formed.

The drift region 24 is formed on the drain region 22 by, for example, an epitaxial growth method. The body region 26 and the source region 28 are formed, for example, on the surface of the drift region 24 using an ion implantation method.

Figure 16:
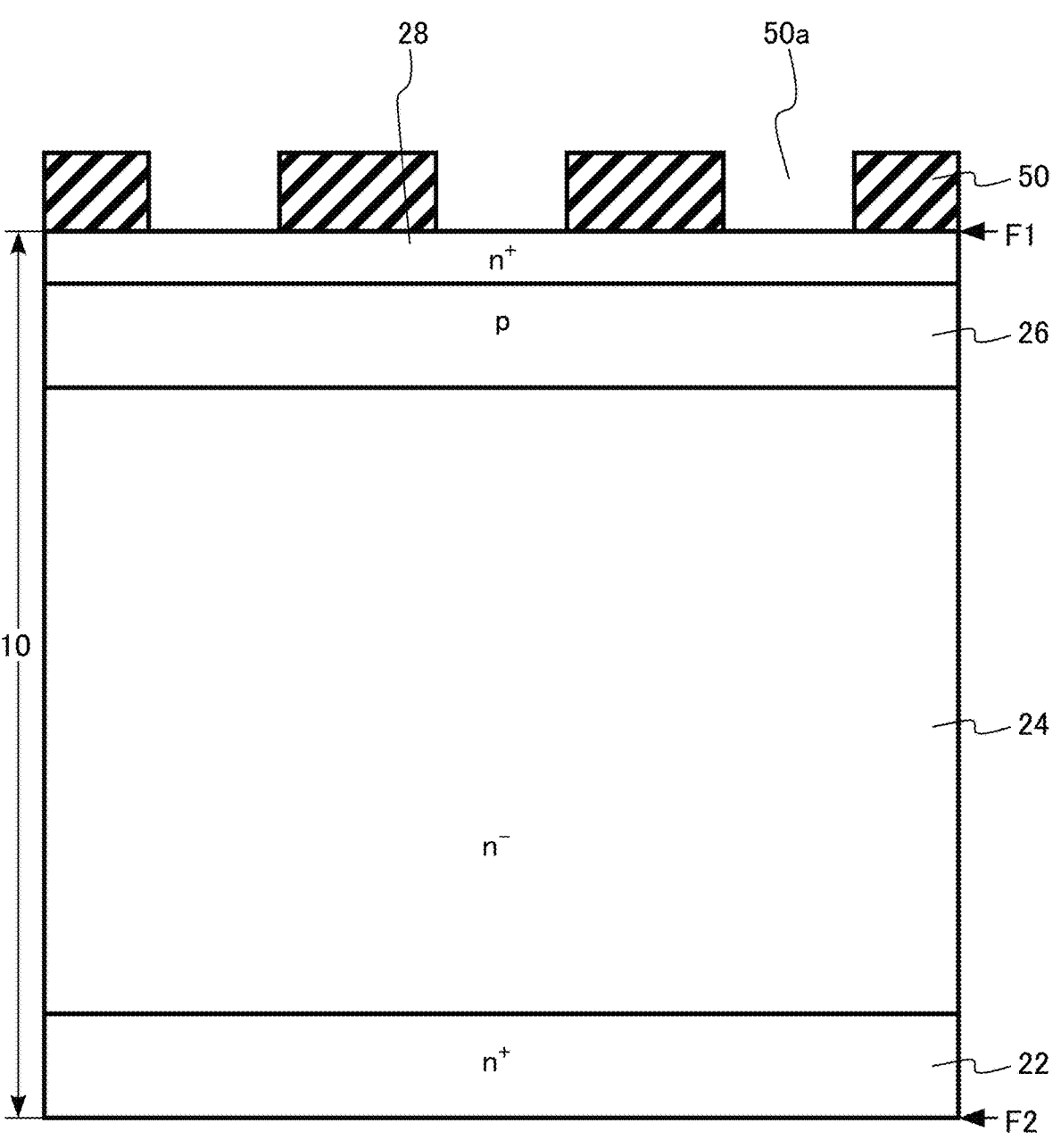
FIG. 16 is an explanatory diagram of the method of manufacturing the semiconductor device according to the second embodiment.

Next, a first mask material 50 having an opening 50a on the surface of the silicon carbide layer 10 is formed (FIG. 16). The first mask material 50 is, for example, an insulator. The first mask material 50 is, for example, silicon oxide.

The first mask material 50 is formed by, for example, depositing an insulating film and patterning the insulating film by photolithography and etching.

Next, the trench 11 is formed in the silicon carbide layer 10 using the first mask material 50 as an etching mask (FIG. 17). The trench 11 is formed using, for example, the RIE method. The trench 11 has a first side face 11x and a second side face 11y.

Next, first ion implantation for implanting carbon (C) into the second side face $11y$ of the trench $11$ is performed using the first mask material $50$ as an ion implantation mask (FIG. 18). The first carbon region $52$ is formed in the silicon carbide layer $10$ by the first ion implantation.

The first ion implantation is performed by, for example, an oblique ion implantation method.

The first ion implantation is performed, for example, at a temperature of 1000° C. or more and 1300° C. or less. The first ion implantation is performed, for example, in a state where the temperature of the silicon carbide layer $10$ is 1000° C. or more and 1300° C. or less.

Next, a second mask material $54$ that covers a part of the trench $11$ is formed (FIG. 19). The second mask material $54$ is formed so as to cover a region where the connection region $34$ is not finally formed. The second mask material $54$ is formed such that only a region where the connection region $34$ is finally formed is opened.

The second mask material $54$ is, for example, an insulator. The second mask material $54$ is, for example, silicon oxide.

The second mask material $54$ is formed by, for example, depositing an insulating film and patterning the insulating film by photolithography and etching.

Figure 20:
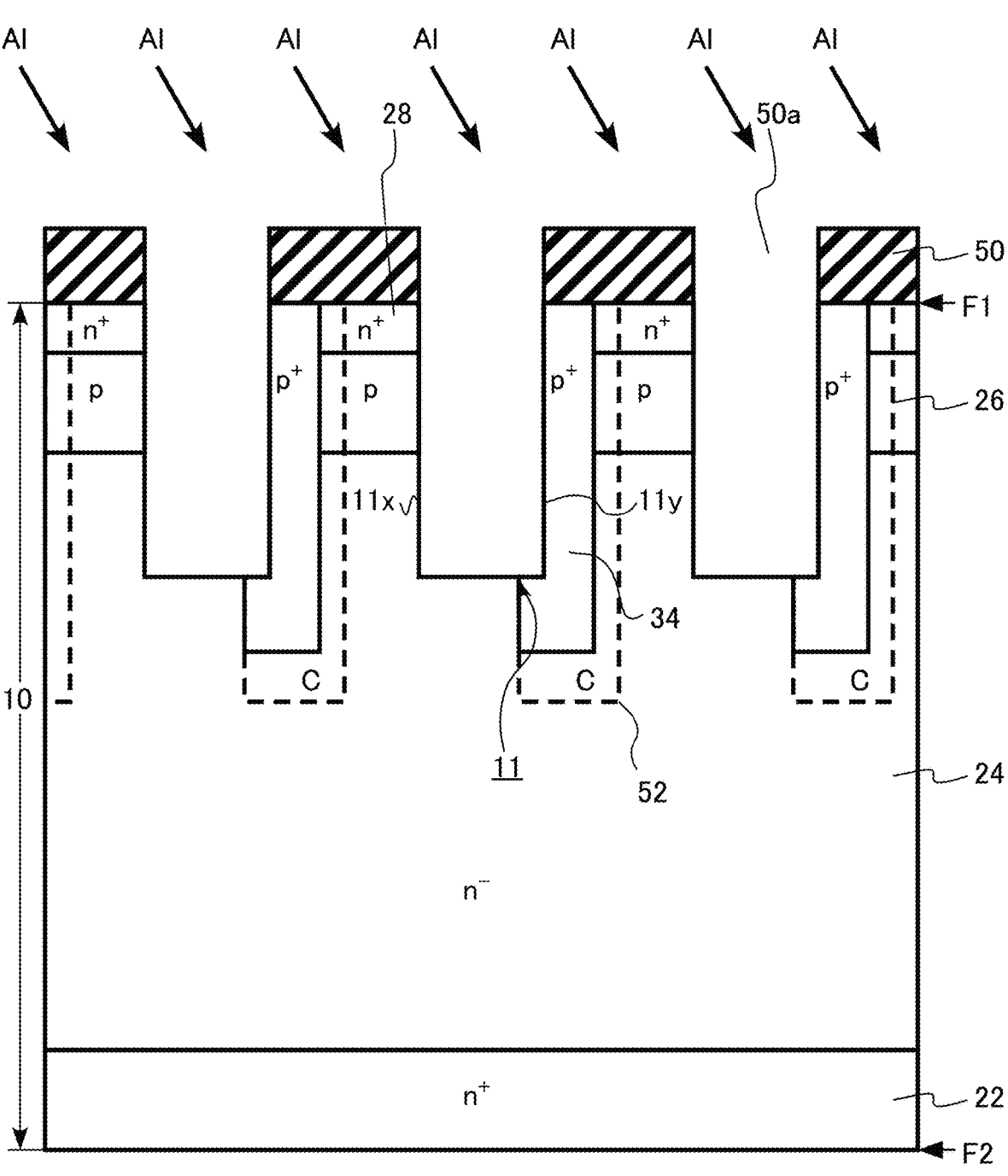
FIG. 20 is an explanatory diagram of the method of manufacturing the semiconductor device according to the second embodiment.

Next, second ion implantation for implanting aluminum (Al) into the second side face $11y$ of the trench $11$ is performed using the first mask material $50$ and the second mask material $54$ as ion implantation masks (FIG. 20). The $p^+$-type connection region $34$ is formed by the second ion implantation. Aluminum (Al) implanted by the second ion implantation is an example of a first impurity.

The second ion implantation is performed by, for example, an oblique ion implantation method.

The second ion implantation is performed, for example, at a temperature of 1000° C. or more and 1300° C. or less. The second ion implantation is performed, for example, in a state where the temperature of the silicon carbide layer $10$ is 1000° C. or more and 1300° C. or less.

The maximum concentration of carbon in the silicon carbide layer $10$ implanted by the first ion implantation is higher than the maximum concentration of aluminum in the silicon carbide layer $10$ implanted by the second ion implantation, for example.

The dose amount of carbon in the first ion implantation is, for example, 10 times or more the dose amount of aluminum in the second ion implantation.

For example, the distribution of carbon implanted into the silicon carbide layer $10$ by the first ion implantation in the silicon carbide layer $10$ before the heat treatment covers the distribution of aluminum implanted into the silicon carbide layer $10$ by the second ion implantation in the silicon carbide layer $10$ before the heat treatment. For example, the distribution of aluminum (Al) implanted by the second ion implantation in the silicon carbide layer $10$ is included in the first carbon region $52$, for example, as illustrated in FIG. 20.

Next, the second mask material $54$ is removed. The second mask material $54$ is removed by, for example, etching using a wet etching method.

Figure 21:
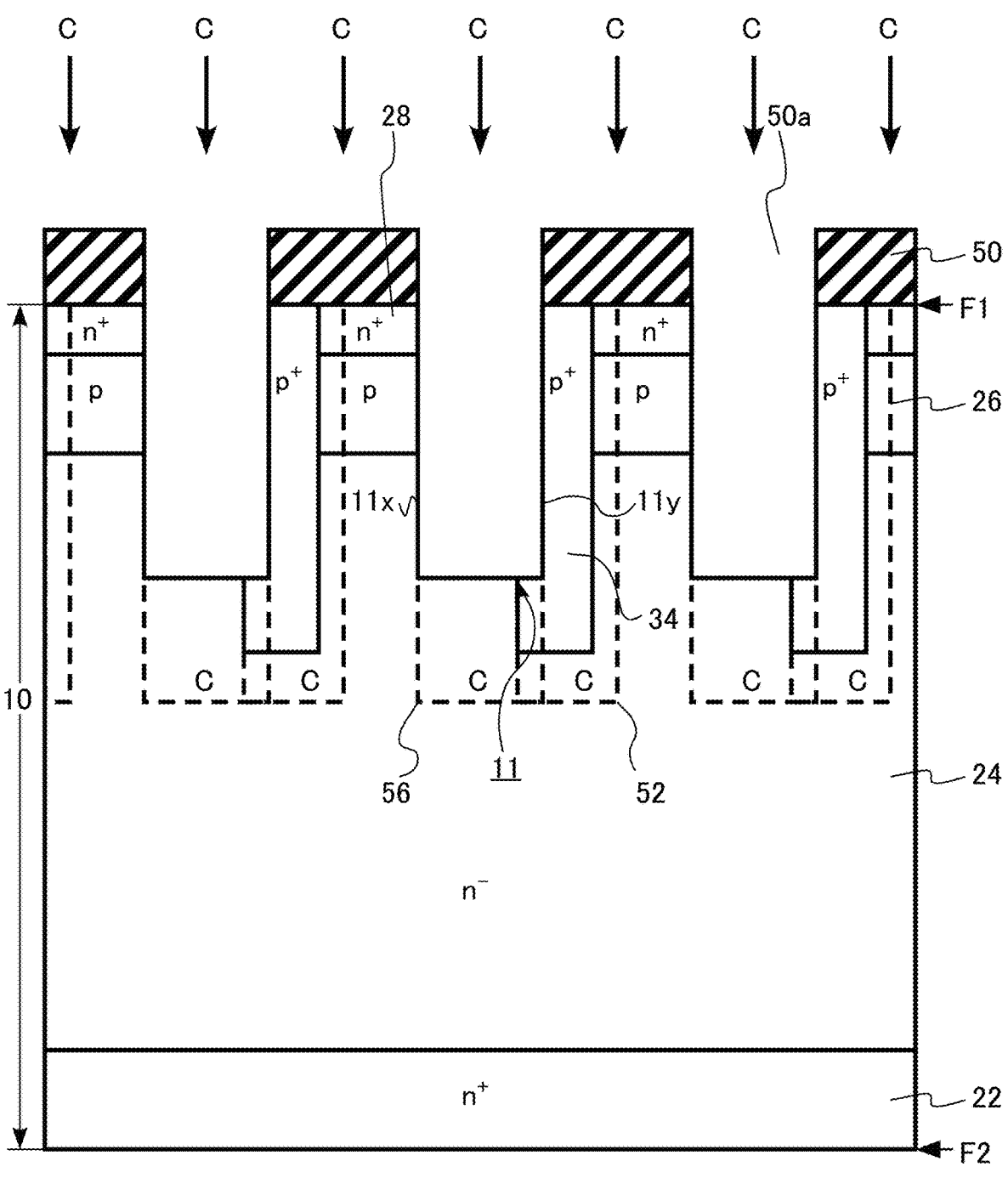
FIG. 21 is an explanatory diagram of the method of manufacturing the semiconductor device according to the second embodiment.

Next, third ion implantation for implanting carbon (C) into the bottom face of the trench $11$ is performed using the first mask material $50$ as an ion implantation mask (FIG. 21). The second carbon region $56$ is formed in the silicon carbide layer $10$ by the third ion implantation.

The third ion implantation is performed, for example, at a temperature of 1000° C. or more and 1300° C. or less. The third ion implantation is performed, for example, in a state where the temperature of the silicon carbide layer $10$ is 1000° C. or more and 1300° C. or less.

Next, a sidewall material $44$ is formed on the side face of the trench $11$. The sidewall material $44$ is, for example, an insulator. The sidewall material $44$ is, for example, silicon oxide.

The bottom face of the trench $11$ is exposed at the bottom of the sidewall material $44$. The sidewall material $44$ is formed by, for example, deposition of an insulating film and etching using a RIE method.

Figure 22:
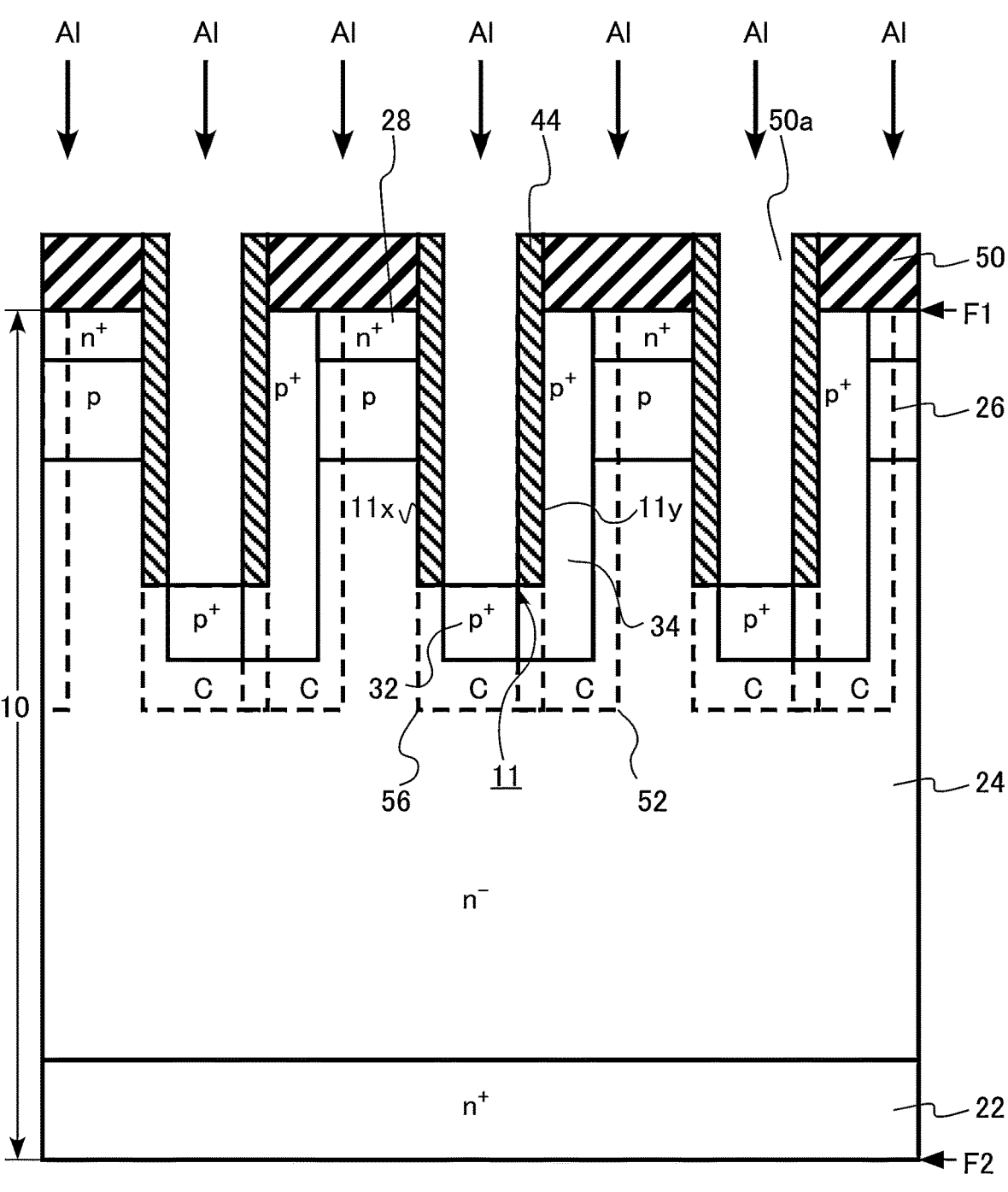
FIG. 22 is an explanatory diagram of the method of manufacturing the semiconductor device according to the second embodiment.

Next, fourth ion implantation for implanting aluminum (Al) into the bottom face of the trench $11$ is performed using the first mask material $50$ and the sidewall material $44$ as ion implantation masks (FIG. 22). The $p^+$-type electric field relaxation region $32$ is formed by the fourth ion implantation. Aluminum (Al) implanted by the fourth ion implantation is an example of the second impurity.

The fourth ion implantation is performed, for example, at a temperature of 1000° C. or more and 1300° C. or less. The fourth ion implantation is performed, for example, in a state where the temperature of the silicon carbide layer $10$ is 1000° C. or more and 1300° C. or less.

The maximum concentration of carbon in the silicon carbide layer $10$ implanted by the third ion implantation is higher than the maximum concentration of aluminum in the silicon carbide layer $10$ implanted by the fourth ion implantation, for example.

The dose amount of carbon in the third ion implantation is, for example, 10 times or more the dose amount of aluminum in the fourth ion implantation.

For example, the distribution of carbon implanted into the silicon carbide layer $10$ by the third ion implantation in the silicon carbide layer $10$ before the heat treatment covers the distribution of aluminum implanted into the silicon carbide layer $10$ by the fourth ion implantation in the silicon carbide layer $10$ before the heat treatment. For example, the distribution of aluminum (Al) implanted by the fourth ion implantation in the silicon carbide layer $10$ is included in the second carbon region $56$, for example, as illustrated in FIG. 22.

Next, the first mask material $50$ and the sidewall material $44$ are removed. The first mask material $50$ and the sidewall material $44$ are removed by, for example, etching using a wet etching method.

Next, a carbon film $46$ is formed on the surface of the silicon carbide layer $10$.

Figure 23:
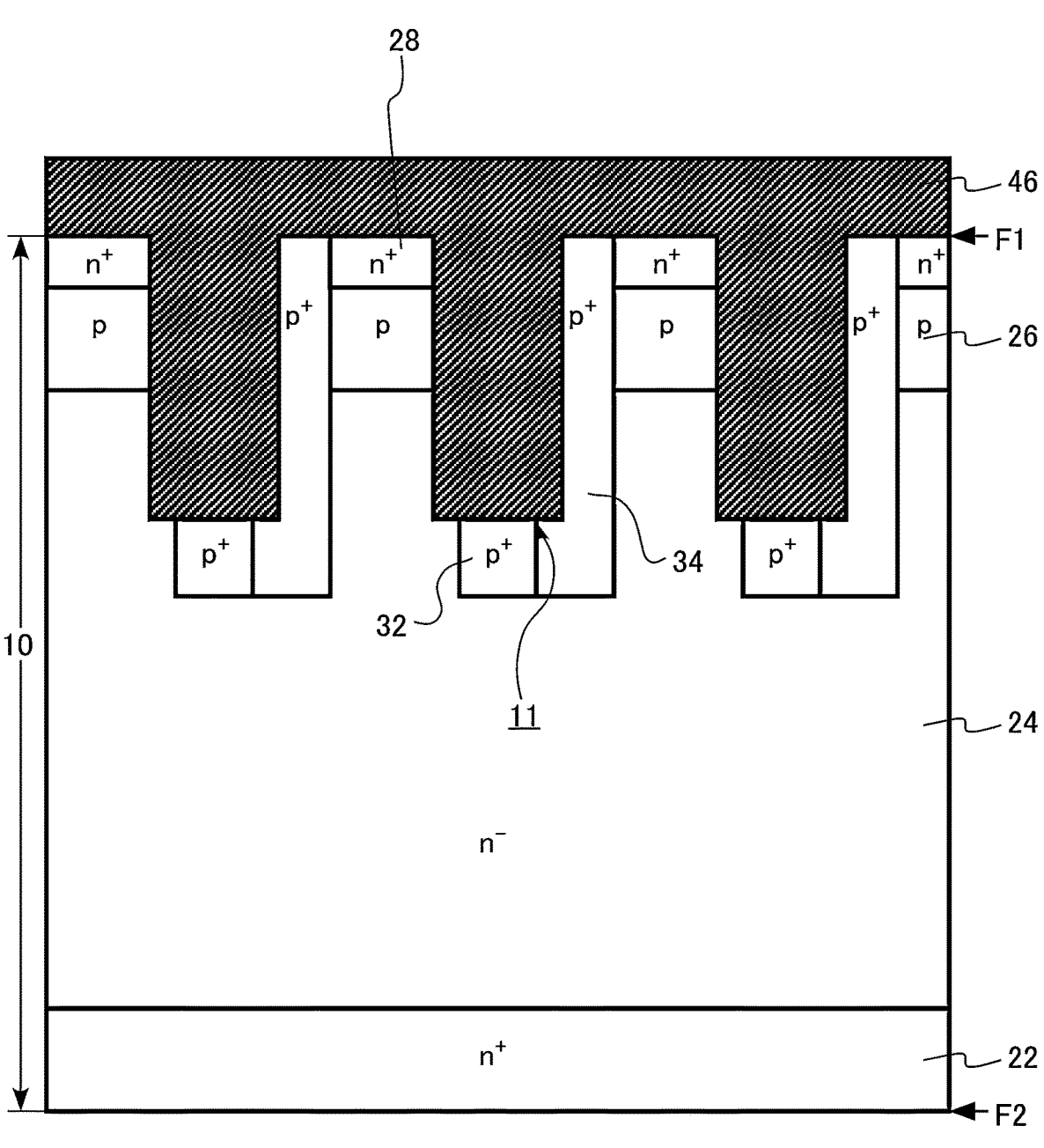
FIG. 23 is an explanatory diagram of the method of manufacturing the semiconductor device according to the second embodiment.

Next, heat treatment is performed (FIG. 23). The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum ion-implanted into the silicon carbide layer $10$. The heat treatment is activation annealing of aluminum. Further, interstitial carbon formed by ion implantation of carbon into the silicon carbide layer $10$ by heat treatment fills carbon vacancies in the silicon carbide layer $10$.

The carbon film $46$ suppresses desorption of silicon and carbon from the silicon carbide layer $10$ into the atmosphere during the heat treatment. Further, the carbon film $46$ absorbs excessive interstitial carbon in the silicon carbide layer $10$ during the heat treatment.

Figure 24:
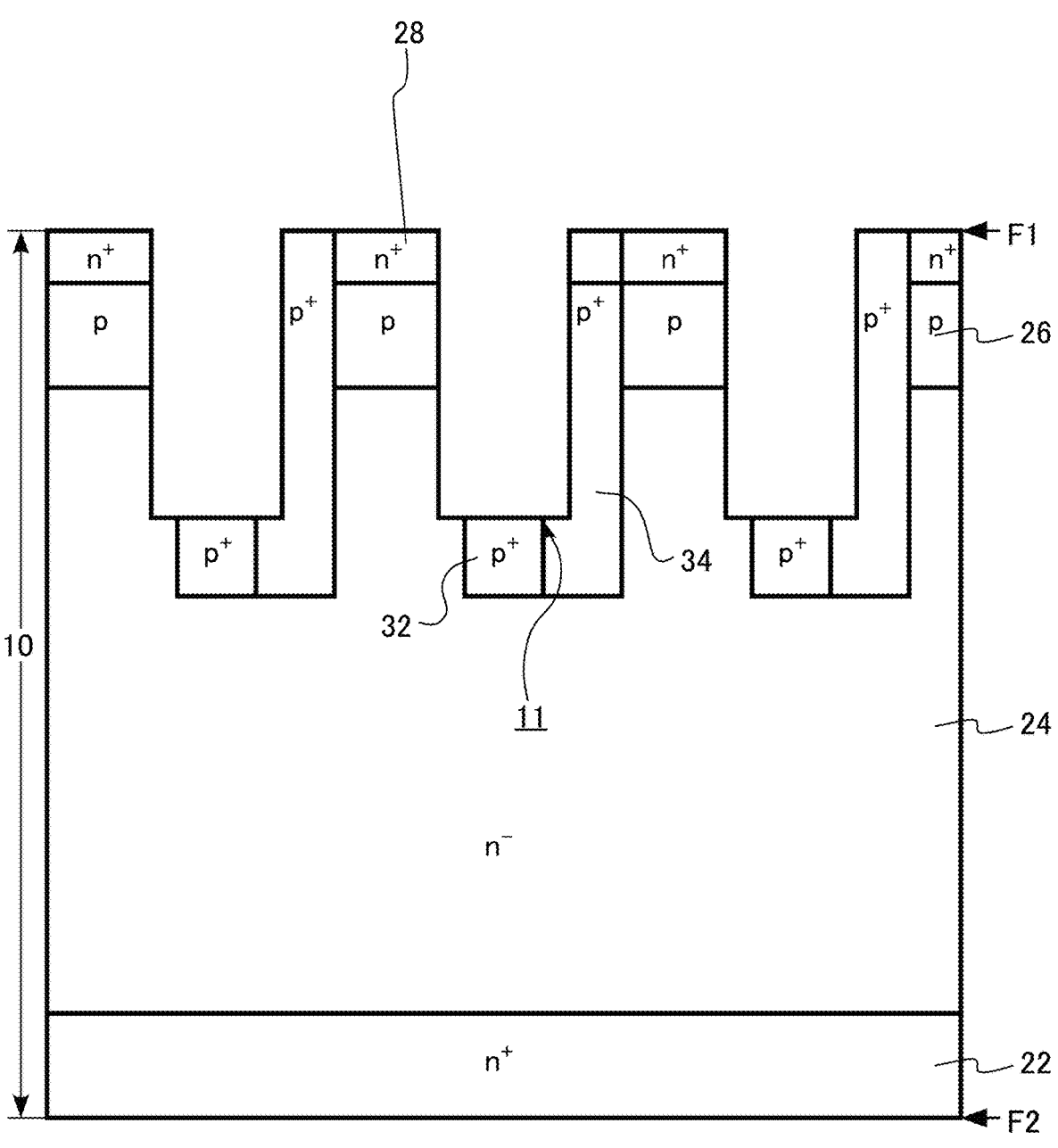
FIG. 24 is an explanatory diagram of the method of manufacturing the semiconductor device according to the second embodiment.

Next, the carbon film $46$ is removed (FIG. 24). Thereafter, the gate insulating layer $14$ and the gate electrode $12$ are formed inside the trench $11$ using a known process technique. Further, the interlayer insulating layer $20$ and the source electrode $16$ are formed on the surface of the silicon carbide layer $10$. Further, the drain electrode $18$ is formed on the back surface of the silicon carbide layer $10$.

The MOSFET 200 illustrated in FIGS. 12, 13, and 14 is manufactured by the above manufacturing method.

Next, functions and effects of the semiconductor device and the method of manufacturing the semiconductor device according to the second embodiment will be described.

According to the MOSFET 200 of the second embodiment, it is possible to reduce the on-resistance and improve the reliability. The details will be described below.

A trench gate structure in which a gate electrode is provided in a trench is applied to the MOSFET 200. By applying the trench gate structure, the channel area per unit area is increased and the on-resistance of the MOSFET 200 is reduced. For example, if the MOSFET 200 is scaled-down by reducing the trench width and the repetition pitch of the trenches, the on-resistance of the MOSFET 200 can be further reduced.

In addition, the MOSFET 200 has the electric field relaxation region 32 at the bottom of the trench 11. By having the electric field relaxation region 32, the electric field applied to the gate insulating layer 14 at the bottom of the trench 11 is relaxed when the MOSFET 200 is turned off. Therefore, the reliability of the gate insulating layer 14 is improved.

In addition, the MOSFET 200 has a connection region 34 that electrically connects the electric field relaxation region 32 and the source electrode 16. Therefore, when the MOSFET 200 is turned off, discharge of holes from the electric field relaxation region 32 is promoted. Therefore, the switching loss of the MOSFET 200 can be reduced.

In addition, since the MOSFET 200 has the connection region 34, it is not necessary to provide a p⁺-type contact region on the first face F1 unlike the MOSFET 100. Therefore, for example, the first distance d1 between two adjacent trenches can be reduced, and the on-resistance of the MOSFET 200 can be decreased.

Figure 25:
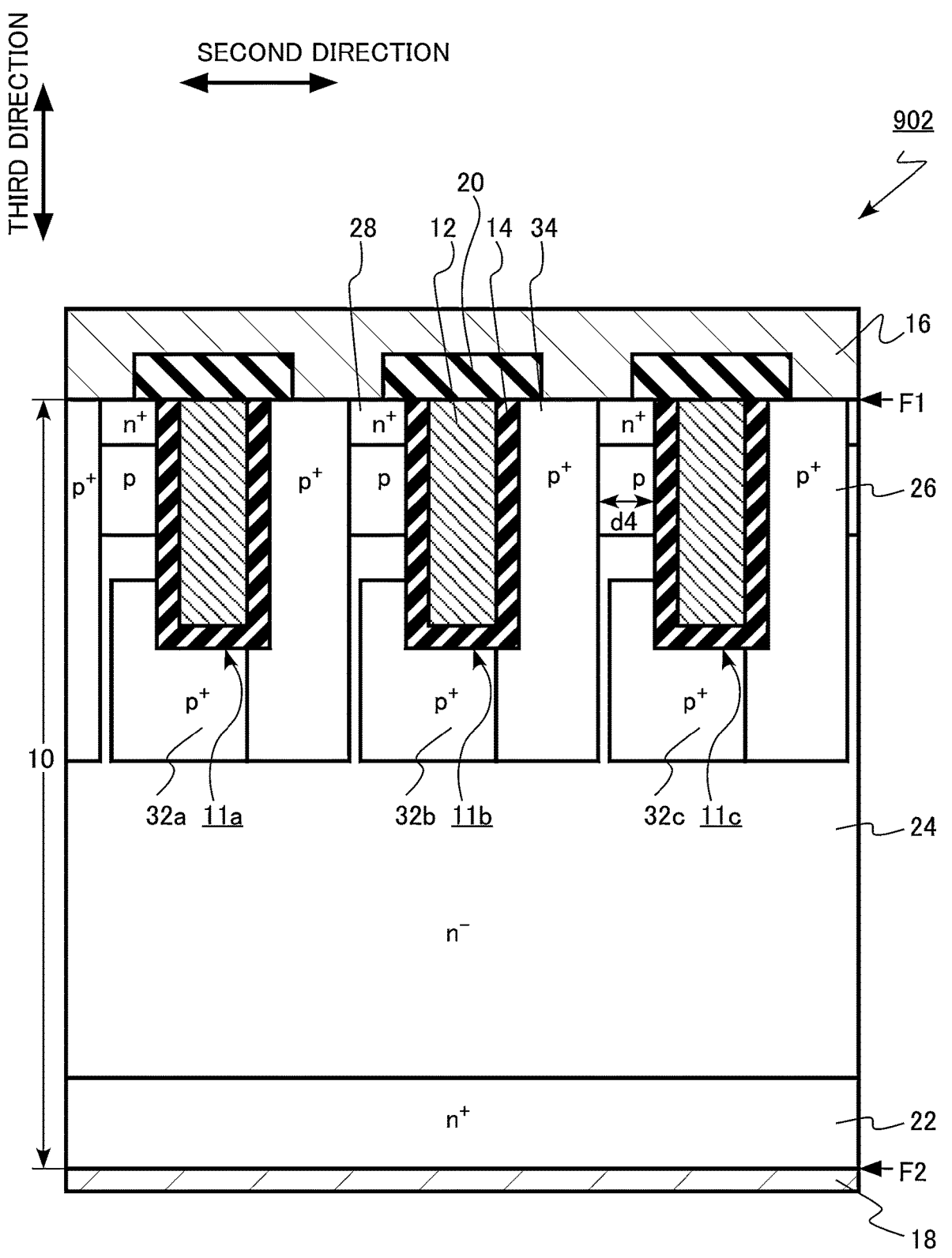
FIG. 25 is a schematic cross-sectional view of a semiconductor device of a second comparative example.
Figure 26:
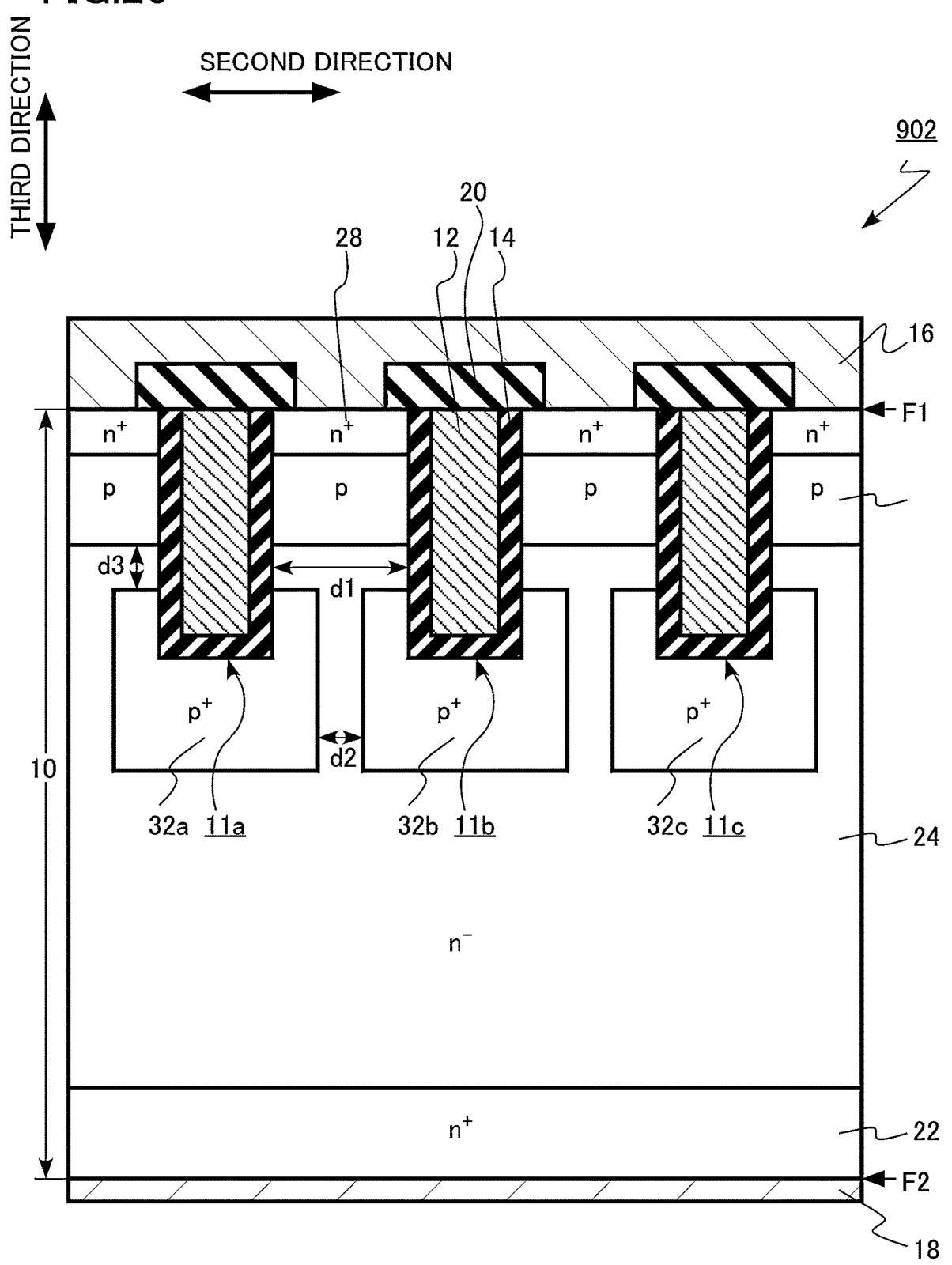
FIG. 26 is a schematic cross-sectional view of the semiconductor device of the second comparative example.
Figure 27:
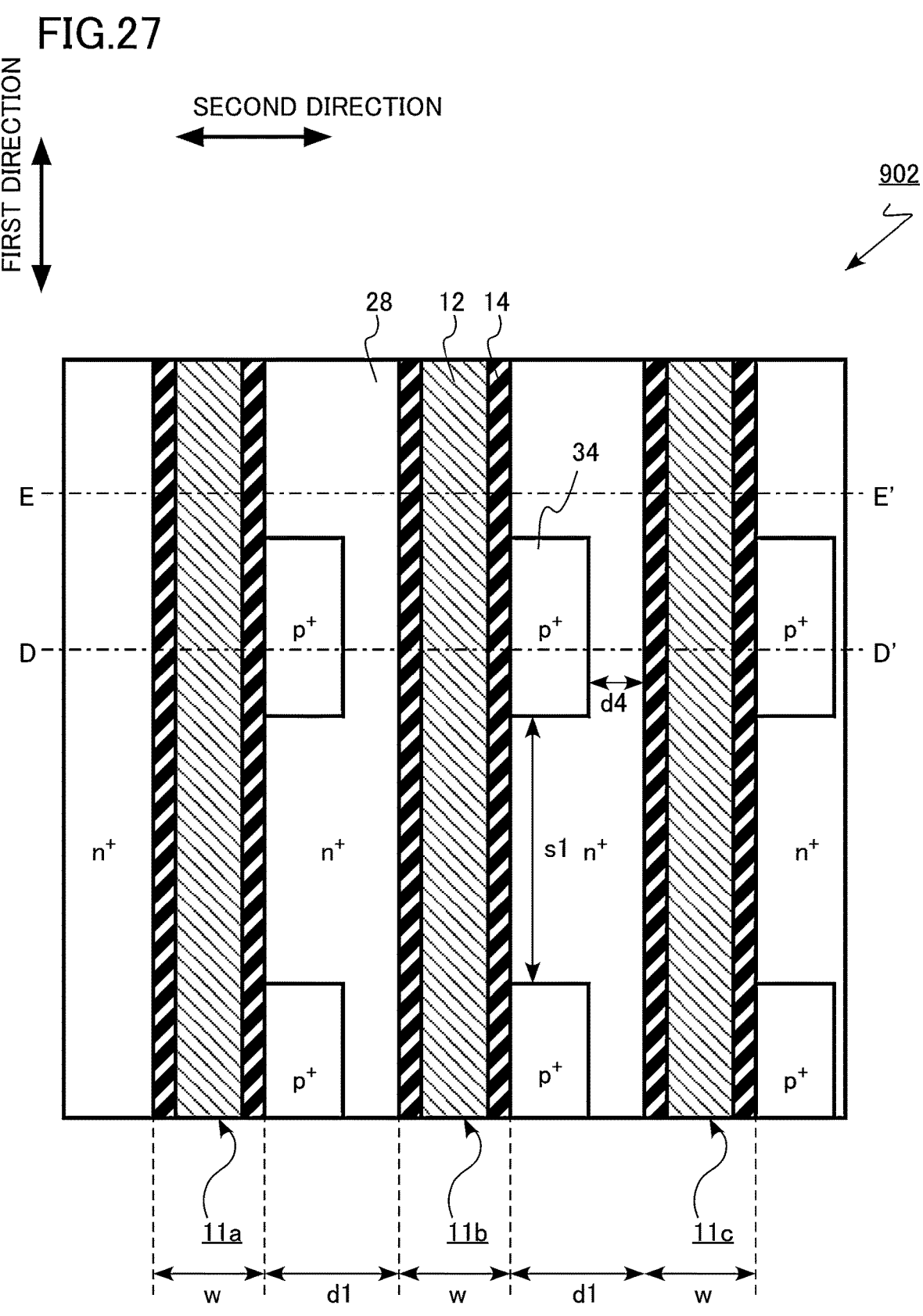
FIG. 27 is a schematic plan view of the semiconductor device of the second comparative example.

FIGS. 25 and 26 are schematic cross-sectional views of a semiconductor device of a second comparative example. FIG. 27 is a schematic plan view of the semiconductor device of the second comparative example.

FIG. 25 is a diagram corresponding to FIG. 12.

FIG. 26 is a diagram corresponding to FIG. 13. FIG. 27 is a diagram corresponding to FIG. 14.

The semiconductor device of the second comparative example is a trench gate type vertical MOSFET 902 using silicon carbide. The MOSFET 902 is an n-channel MOSFET using electrons as carriers.

The MOSFET 902 of the second comparative example is a MOSFET manufactured by a manufacturing method different from the method of manufacturing the semiconductor device according to the second embodiment. The MOSFET 902 of the second comparative example is manufactured without performing the first ion implantation and the third ion implantation included in the method of manufacturing the semiconductor device of the second embodiment. In the first ion implantation, carbon (C) is implanted into the second side face 11y of the trench. In the third ion implantation, carbon (C) is implanted into the bottom face of the trench.

In the MOSFET 902 of the second comparative example, a second distance (d2 in FIG. 26) in the second direction between the adjacent electric field relaxation regions 32 is smaller than that of the MOSFET 200 of the second embodiment. In addition, in the MOSFET 902 of the second comparative example, a third distance (d3 in FIG. 26) in the third direction between the electric field relaxation region 32 and the body region 26 is smaller than that of the MOSFET 200 of the second embodiment. In addition, in the MOSFET

902 of the second comparative example, a fourth distance (d4 in FIGS. 25 and 27) between the connection region 34 and the trench 11 is smaller than that of the MOSFET 200 of the second embodiment.

In addition, in the MOSFET 902 of the second comparative example, a first interval (s1 in FIG. 27) in the first direction between two adjacent connection regions 34 is smaller than the first interval (s1 in FIG. 14) in the first direction between two adjacent connection regions 34 of the MOSFET 200 of the second embodiment.

When the second distance d2 in the second direction between the adjacent electric field relaxation regions 32 decreases, the current path flowing through the drift region 24 is narrowed during the on-operation of the MOSFET. In addition, when the third distance d3 in the third direction between the electric field relaxation region 32 and the body region 26 decreases, the current path flowing through the drift region 24 is narrowed during the on-operation of the MOSFET. Therefore, the on-resistance of the MOSFET increases.

In addition, when the third distance d3 in the third direction between the electric field relaxation region 32 and the body region 26 decreases, the threshold voltage of the MOSFET may fluctuate due to the fluctuation of the third distance d3. In addition, when the fourth distance d4 between the connection region 34 and the trench 11 decreases, the threshold voltage of the MOSFET may fluctuate.

In addition, when the first interval s1 in the first direction between the two adjacent connection regions 34 decreases, the channel area per unit area decreases, and the on-resistance of the MOSFET decreases.

For example, if the diffusion of aluminum in the electric field relaxation region 32 can be suppressed, the second distance d2 in the second direction between the adjacent electric field relaxation regions 32 and the third distance d3 in the third direction between the electric field relaxation region 32 and the body region 26 increase, and the on-resistance of the MOSFET can be reduced.

For example, if diffusion of aluminum in the connection region 34 can be suppressed, the fourth distance d4 between the connection region 34 and the trench 11 increases, and fluctuation of the threshold voltage of the MOSFET can be suppressed.

For example, if the diffusion of aluminum in the connection region 34 can be suppressed, the first interval s1 in the first direction between the two connection regions 34 adjacent to each other in the first direction increases, and the on-resistance of the MOSFET can be reduced.

In the method of manufacturing the semiconductor device according to the second embodiment, carbon (C) is introduced into a range wider than a range in which impurities are ion-implanted by ion implantation. By the above method, the density of carbon vacancies in the silicon carbide layer is reduced, and diffusion of impurities ion-implanted into the silicon carbide layer due to heat treatment can be suppressed.

Diffusion of impurities in the silicon carbide layer 10 is promoted by the carbon vacancies in the silicon carbide layer 10. In the method of manufacturing the semiconductor device according to the second embodiment, the carbon region is formed by ion implantation of carbon, so that the carbon vacancy density in the silicon carbide layer 10 is reduced. Therefore, diffusion of impurities is suppressed, and the diffusion of aluminum in the connection region 34 and the electric field relaxation region 32 can be suppressed.

In the method of manufacturing the semiconductor device according to the second embodiment, carbon is ion-implanted into the side face of the trench 11 by the first ion implantation to form the first carbon region 52, and then the second ion implantation is performed into the side face of the trench 11 to ion-implant aluminum into the side face of the trench 11. Therefore, the distribution of aluminum is included in the first carbon region 52.

In addition, in the method of manufacturing the semiconductor device according to the second embodiment, carbon is ion-implanted into the bottom face of the trench 11 by the third ion implantation to form the second carbon region 56, and then the fourth ion implantation is performed using the sidewall material 44 as a mask to ion-implant aluminum into the bottom face of the trench 11.

Therefore, at least in the second direction, the distribution of aluminum is covered by the second carbon region 56.

In the method of manufacturing the semiconductor device according to the second embodiment, the carbon region is formed in a region where diffusion of aluminum in the lateral direction is scheduled before the heat treatment for diffusing aluminum. Therefore, diffusion of aluminum in the lateral direction is effectively suppressed.

Therefore, according to the method of manufacturing the semiconductor device of the second embodiment, as compared with the MOSFET 902 of the second comparative example, the MOSFET 200 in which the second distance d2 in the second direction between the adjacent electric field relaxation regions 32 and the third distance d3 in the third direction between the electric field relaxation region 32 and the body region 26 are large can be manufactured. Therefore, the MOSFET 200 that can reduce the on-resistance can be manufactured.

Further, in the MOSFET 200, the third distance d3 in the third direction between the electric field relaxation region 32 and the body region 26 increases, so that the fluctuation of the threshold voltage is suppressed. Furthermore, in the MOSFET 200, the fluctuation of the threshold voltage is suppressed by increasing the fourth distance d4 between the connection region 34 and the trench 11.

Furthermore, in the MOSFET 200, the first interval s1 in the first direction between the two adjacent connection regions 34 increases, and the on-resistance of the MOSFET 200 can be reduced.

In addition, since the diffusion of aluminum in the electric field relaxation region 32 can be suppressed, the p-type impurity concentration of the electric field relaxation region 32 can be increased. In addition, since the diffusion of aluminum in the connection region 34 can be suppressed, the p-type impurity concentration of the connection region 34 can be increased.

Therefore, the electric resistance of the electric field relaxation region 32 and the connection region 34 is reduced. Therefore, for example, when the MOSFET 200 is turned off, discharge of holes from the electric field relaxation region 32 and the connection region 34 is promoted. Therefore, the switching loss of the MOSFET 200 can be reduced. In addition, the electric resistance of the electric field relaxation region 32 and the connection region 34 is reduced. Therefore, the first interval s1 in the first direction between the two connection regions 34 adjacent to each other in the first direction can be increased, and the on-resistance of the MOSFET 200 can be further reduced.

In addition, by increasing the p-type impurity concentration of the electric field relaxation region 32, the electric field applied to the gate insulating layer 14 at the bottom of the trench 11 is further relaxed when the MOSFET 200 is turned off. Therefore, the reliability of the gate insulating layer 14 of the MOSFET 200 is improved.

In the method of manufacturing the semiconductor device according to the second embodiment, the first ion implantation and the third ion implantation for implanting carbon are preferably performed at a temperature of 1000° C. or more. By introducing carbon into the silicon carbide layer 10 at a temperature of 1000° C. or more, interstitial carbon enters carbon vacancies during ion implantation, and the carbon vacancy density can be reduced. Therefore, for example, diffusion of impurities when the subsequent ion implantation of impurities is performed at a high temperature can be suppressed.

In addition, ion implantation of carbon at a temperature of 1000° C. or more can reduce damage due to the ion implantation of carbon. Therefore, the characteristics of the MOSFET 200 are improved.

The second ion implantation and the fourth ion implantation for implanting aluminum (Al) are preferably performed at a temperature of 1000° C. or more. Impurity ion implantation at a temperature of 1000° C. or more can reduce damage due to the impurity ion implantation. Since amorphization of the silicon carbide layer 10 due to damage can be suppressed and the crystallinity can be kept high, the activation efficiency after the activation annealing can be increased. Since the crystallinity of the silicon carbide layer 10 can be maintained higher as the temperature of ion implantation is higher, the temperature of ion implantation is more preferably 1100° C. or more.

From the viewpoint of suppressing degradation of the mask material 40 and the sidewall material 44 due to heat, the temperatures of the first ion implantation, the second ion implantation, the third ion implantation, and the fourth ion implantation are preferably 1300° C. or less, and more preferably 1200° C. or less.

Since the first carbon region 52 is formed by the first implantation of carbon prior to the second ion implantation of aluminum, diffusion of impurities due to ion implantation at a high temperature can be suppressed.

From the viewpoint of suppressing the diffusion of aluminum, the maximum concentration of carbon in the silicon carbide layer 10 implanted by the first ion implantation is preferably higher than the maximum concentration of aluminum in the silicon carbide layer 10 implanted by the second ion implantation.

From the viewpoint of suppressing the diffusion of aluminum, the dose amount of carbon in the first ion implantation is preferably 10 times or more, more preferably 100 times or more the dose amount of aluminum in the second ion implantation.

From the viewpoint of suppressing the diffusion of aluminum, the distribution of carbon implanted into the silicon carbide layer 10 by the first ion implantation in the silicon carbide layer 10 before the heat treatment preferably covers the distribution of aluminum implanted into the silicon carbide layer 10 by the second ion implantation in the silicon carbide layer 10 before the heat treatment.

Since the second carbon region 56 is formed by the third ion implantation of carbon prior to the fourth ion implantation of aluminum, diffusion of impurities due to ion implantation at a high temperature can be suppressed.

From the viewpoint of suppressing the diffusion of aluminum, the maximum concentration of carbon in the silicon carbide layer 10 implanted by the third ion implantation is preferably higher than the maximum concentration of aluminum in the silicon carbide layer 10 implanted by the fourth ion implantation.

From the viewpoint of suppressing the diffusion of aluminum, the dose amount of carbon in the third ion implantation is preferably 10 times or more, more preferably 100 times or more the dose amount of aluminum in the fourth ion implantation.

From the viewpoint of suppressing the diffusion of aluminum, the distribution of carbon implanted into the silicon carbide layer 10 by the third ion implantation in the silicon carbide layer 10 before the heat treatment preferably covers the distribution of aluminum implanted into the silicon carbide layer 10 by the fourth ion implantation in the silicon carbide layer 10 before the heat treatment.

The temperature of the heat treatment is preferably 1850° C. or more. When the heat treatment is performed at 1850° C. or more, the activation rate of impurities is improved. Since a carbon region is formed by the ion implantation of carbon prior to ion implantation of aluminum, diffusion of aluminum can be suppressed even when the heat treatment is performed at 1850° C. or more.

In the MOSFET 200 of the second embodiment, the first distance (d1 in FIGS. 13 and 14) between two adjacent trenches 11 is 1.0 μm or less. The second distance (d2 in FIG. 13) between the two adjacent electric field relaxation regions 32 is ½ or more of the first distance (d1 in FIGS. 13 and 14) between the two adjacent trenches 11.

Although the first distance d1 between the two adjacent trenches 11 is as small as 1.0 μm or less, the distance d2 between the two adjacent electric field relaxation regions 32 is not narrowed. Therefore, the on-resistance of the MOSFET 200 can be reduced.

Further, in the MOSFET 200 of the second embodiment, the p-type impurity concentration of the electric field relaxation region 32 is higher than $1\times10^{20}$ cm$^{-3}$. Therefore, the switching loss of the MOSFET 200 is reduced. In addition, the reliability of the gate insulating layer 14 is improved.

From the viewpoint of reducing the on-resistance of the MOSFET 200, the first distance d1 between the two adjacent trenches 11 is preferably 0.8 μm or less, and more preferably 0.6 μm or less.

From the viewpoint of reducing the on-resistance of the MOSFET 200, the second distance d2 between the two adjacent electric field relaxation regions 32 is preferably ⅔ or more of the first distance d1 between the two adjacent trenches 11, more preferably ⅘ or more of the first distance d1, and still more preferably the first distance d1 or more.

From the viewpoint of reducing the switching loss of the MOSFET 200 and improving the reliability of the gate insulating layer 14, the p-type impurity concentration of the electric field relaxation region 32 is preferably $5\times10^{20}$ cm$^{-3}$ or more, and more preferably $1\times10^{21}$ cm$^{-3}$ or more.

As described above, according to the method of manufacturing the semiconductor device and the semiconductor device of the second embodiment, it is possible to reduce the on-resistance.

In the first and second embodiments, aluminum (Al) has been described as an example of the p-type impurity, but boron (B) can also be applied as the p-type impurity.

As described above, in the first and second embodiments, the case where the first ion implantation is performed before the second ion implantation has been described as an example, but the first ion implantation may be performed after the second ion implantation. In the second embodiment, the case where the third ion implantation is performed before the fourth ion implantation has been described as an example, but the third ion implantation may be performed after the fourth ion implantation.

As described above, in the first and second embodiments, the case where 4H-SiC is used as the crystal structure of silicon carbide has been described as an example. However, the present disclosure can also be applied to silicon carbide having another crystal structure such as 6H-SiC, 3C-SiC, or the like.

In the first and second embodiments, the MOSFET has been described as an example of the semiconductor device, but the present invention can also be applied to an insulated gate bipolar transistor (IGBT). For example, an IGBT can be realized by replacing a region corresponding to the drain region 22 of the MOSFET 100 from n-type to p-type.

While certain embodiments have been described, these embodiments have been presented by way of example only, and are not intended to limit the scope of the inventions. Indeed, the method of manufacturing the semiconductor device and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a mask material having an opening on a surface of a silicon carbide layer;
    forming a trench in the silicon carbide layer using the mask material as a mask;
    performing first ion implantation for implanting carbon (C) into a bottom face of the trench using the mask material as a mask;
    forming a sidewall material on a side face of the trench;
    performing second ion implantation for implanting a p-type first impurity into the bottom face of the trench using the sidewall material as a mask;
    performing third ion implantation for implanting carbon (C) into the bottom face of the trench using the sidewall material as a mask; and
    performing heat treatment at 1600° C. or more,
    wherein a dose amount of carbon (C) implanted by the third ion implantation is higher than a dose amount of carbon (C) implanted by the first ion implantation.

2. The method of manufacturing a semiconductor device according to claim 1,
    wherein the first ion implantation is performed at a temperature of 1000° C. or more.

3. The method of manufacturing a semiconductor device according to claim 2, wherein the second ion implantation is performed at a temperature of 1000° C. or more.

4. The method of manufacturing a semiconductor device according to claim 1, wherein a dose amount of carbon (C) implanted by the first ion implantation is 10 times or more a dose amount of the first impurity implanted by the second ion implantation.

5. The method of manufacturing a semiconductor device according to claim 1, wherein the first impurity is aluminum (Al).

* * * * *